(12) United States Patent
Shishido et al.

(10) Patent No.: US 10,777,574 B2
(45) Date of Patent: Sep. 15, 2020

(54) SEMICONDUCTOR DEVICE AND METHOD OF MANUFACTURING SEMICONDUCTOR DEVICE

(71) Applicant: TOSHIBA MEMORY CORPORATION, Minato-ku (JP)

(72) Inventors: Masayuki Shishido, Yokkaichi (JP); Tatsuya Fujishima, Yokkaichi (JP); Nozomi Kido, Yokkaichi (JP); Tomonori Kajino, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/299,566

(22) Filed: Mar. 12, 2019

(65) Prior Publication Data

US 2020/0091182 A1 Mar. 19, 2020

(30) Foreign Application Priority Data

Sep. 19, 2018 (JP) .................. 2018-175366

(51) Int. Cl.
| | | |
|---|---|---|
| *H01L 27/11582* | (2017.01) | |
| *H01L 21/768* | (2006.01) | |
| *H01L 27/11565* | (2017.01) | |
| *H01L 23/544* | (2006.01) | |
| *H01L 23/522* | (2006.01) | |
| *H01L 21/28* | (2006.01) | |

(52) U.S. Cl.
CPC .. *H01L 27/11582* (2013.01); *H01L 21/76897* (2013.01); *H01L 23/5226* (2013.01); *H01L 23/544* (2013.01); *H01L 27/11565* (2013.01); *H01L 29/40117* (2019.08); *H01L 2223/54426* (2013.01)

(58) Field of Classification Search
CPC ......... H01L 27/11582; H01L 27/11565; H01L 29/40117; H01L 21/76897; H01L 23/5226; H01L 23/544; H01L 2223/54426
USPC ..................................................... 257/324
See application file for complete search history.

(56) References Cited

U.S. PATENT DOCUMENTS

| | | |
|---|---|---|
| 8,749,078 B2 | 6/2014 | Murakami |
| 9,985,046 B2 | 5/2018 | Lu et al. |
| 2012/0182779 A1 | 7/2012 | Fukuda |

(Continued)

FOREIGN PATENT DOCUMENTS

| | | |
|---|---|---|
| JP | 2012-151169 | 8/2012 |
| JP | 2013-187338 | 9/2013 |
| JP | 2017-518635 | 7/2017 |

*Primary Examiner* — Tu-Tu V Ho
(74) *Attorney, Agent, or Firm* — Oblon, McClelland, Maier & Neustadt, L.L.P.

(57) ABSTRACT

According to one embodiment, in a semiconductor device, a stacked body is disposed above a substrate. In the stacked body, a conductive film and an insulating layer are alternately disposed in a stacking direction. A semiconductor columnar member penetrates the stacked body in a stacking direction. An insulating film surrounds the semiconductor columnar member. The insulating film penetrates the stacked body in the stacking direction. A pattern is disposed at a position adjacent to or close to a region. The region includes a penetration plug. The penetration plug extends from a position same as or above an upper end of the stacked body to a position below a lower end of the stacked body in the stacking direction. The pattern has a quadrangular or disjoined quadrangular shape.

19 Claims, 13 Drawing Sheets

(56) References Cited

U.S. PATENT DOCUMENTS

2015/0371925 A1 12/2015 Thimmegowda et al.
2016/0163732 A1* 6/2016 Lim .................. H01L 27/11582
                                                              257/314

* cited by examiner

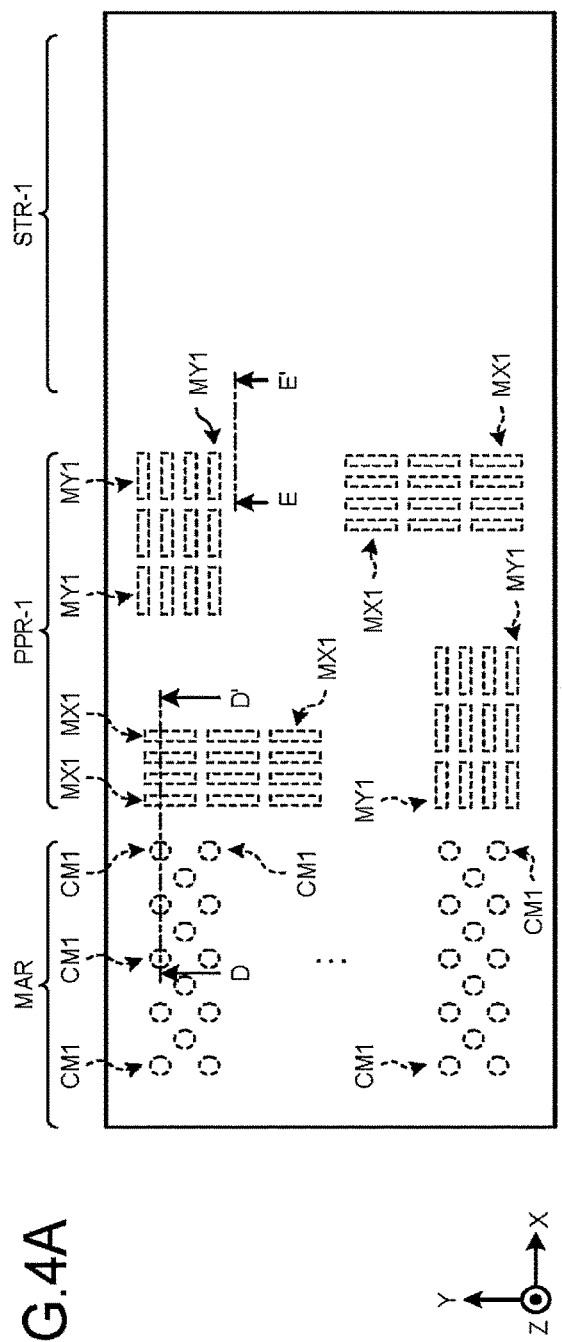
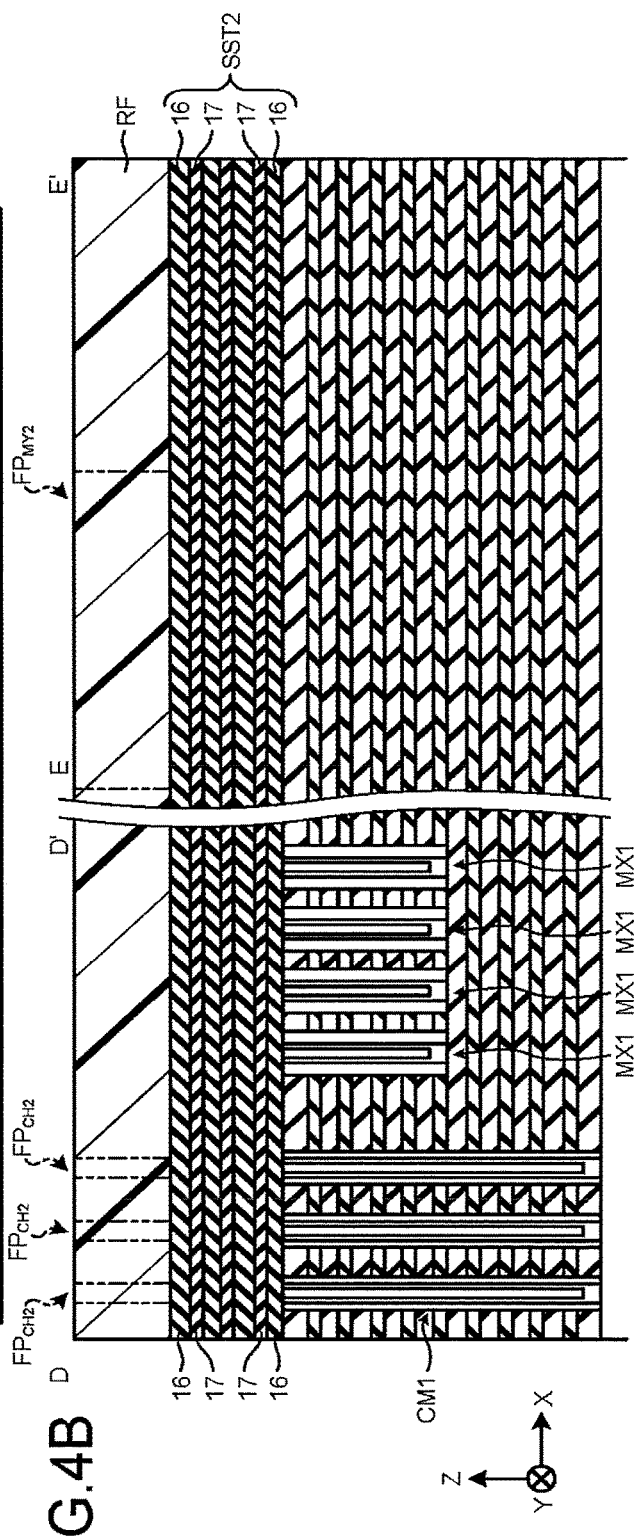
FIG.4A
FIG.4B

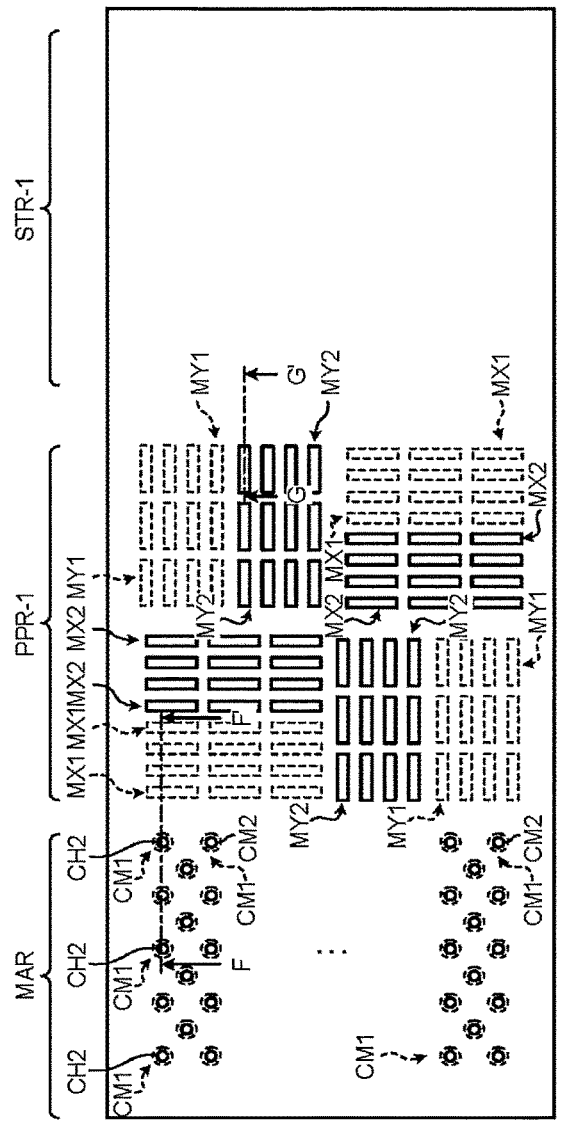
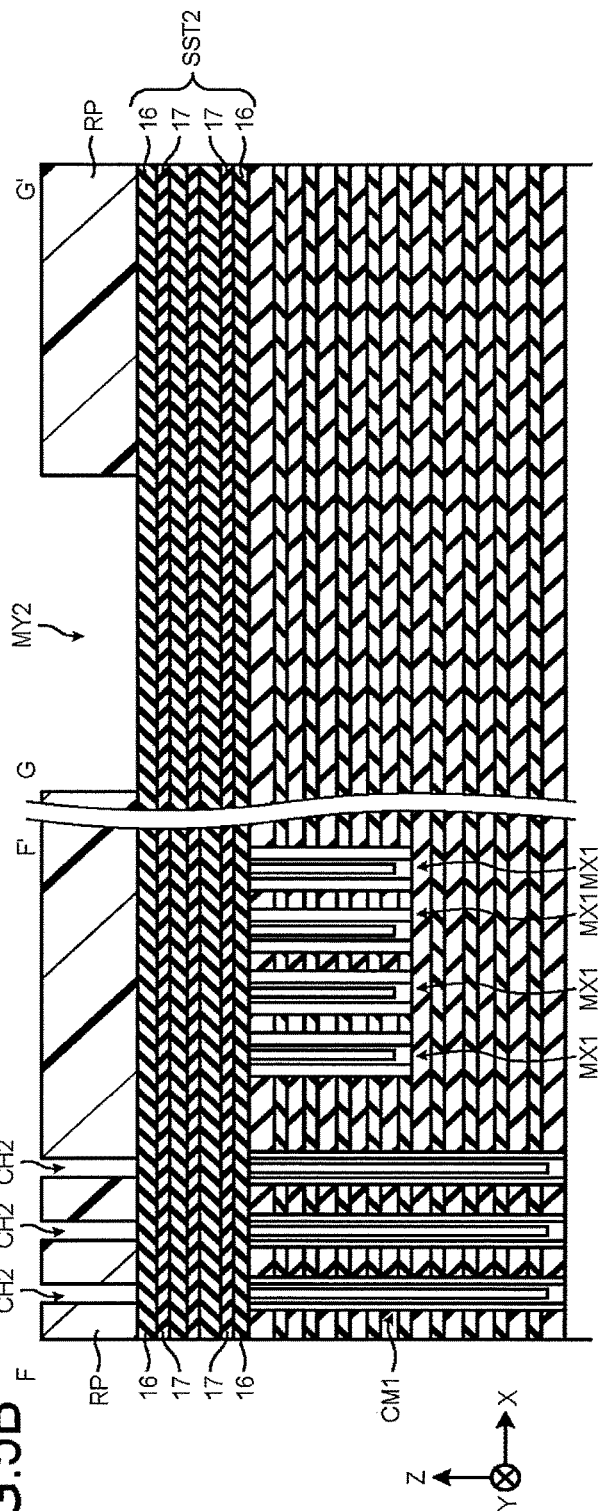
FIG.5A
FIG.5B

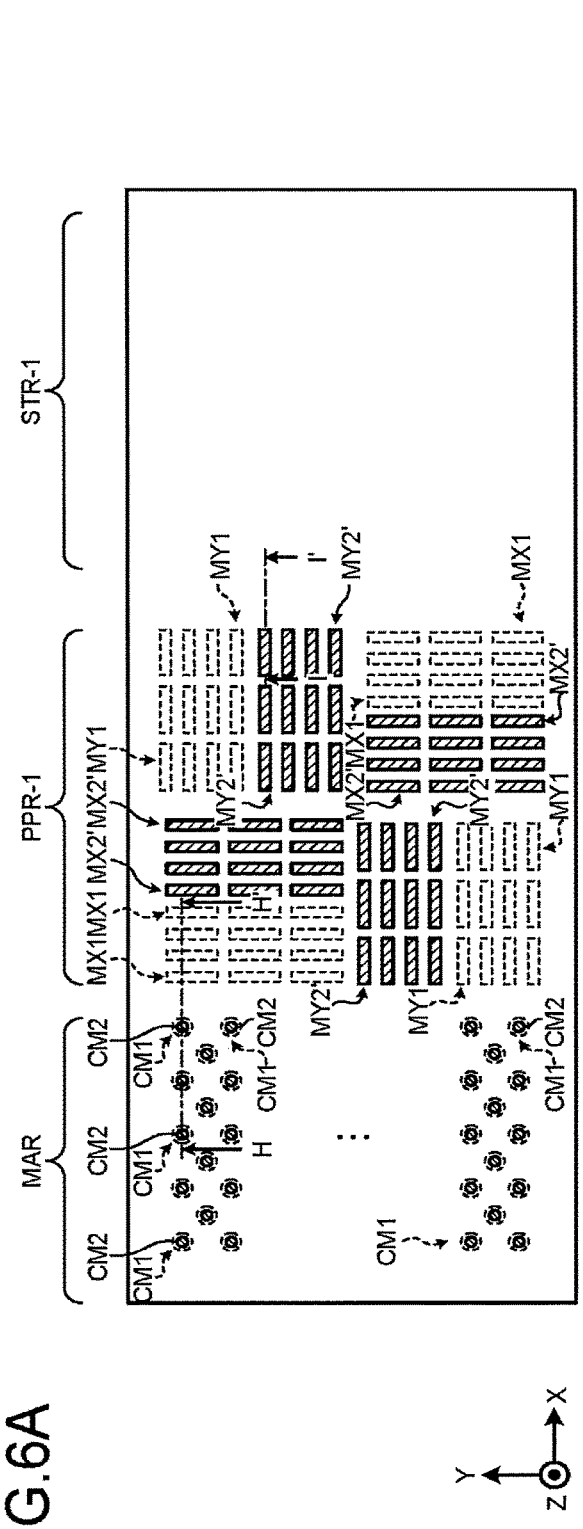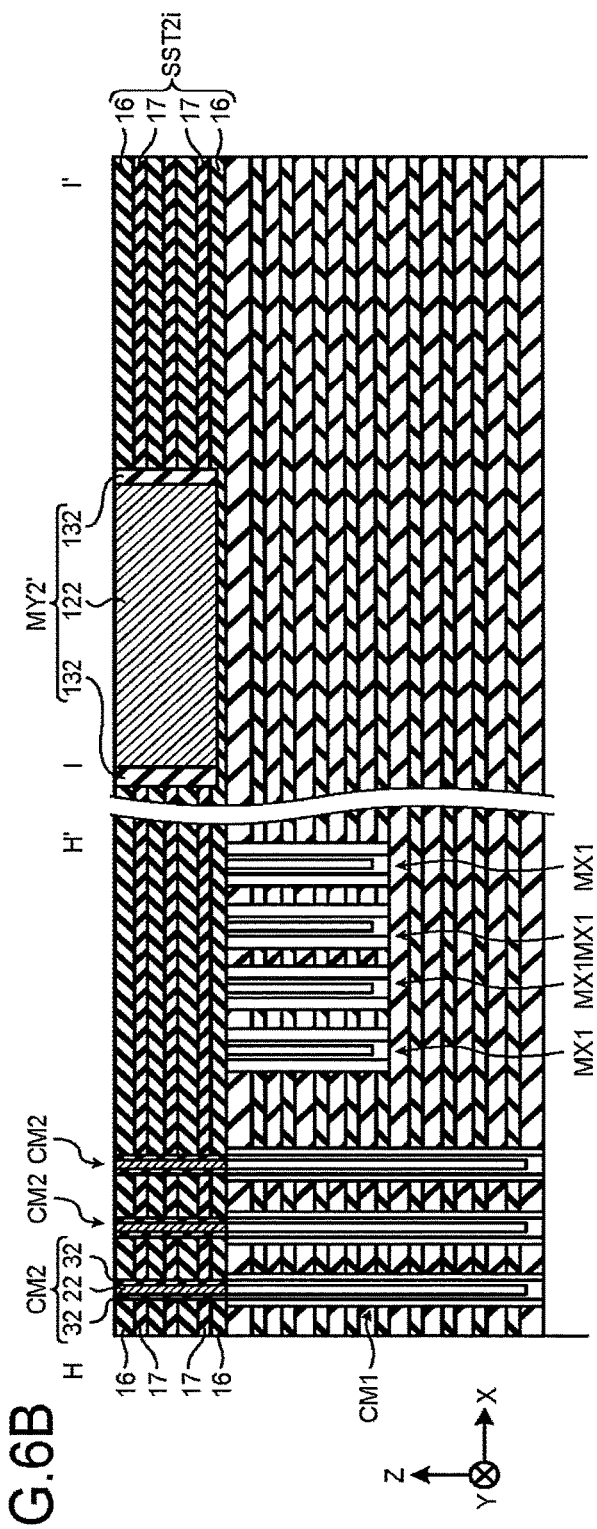

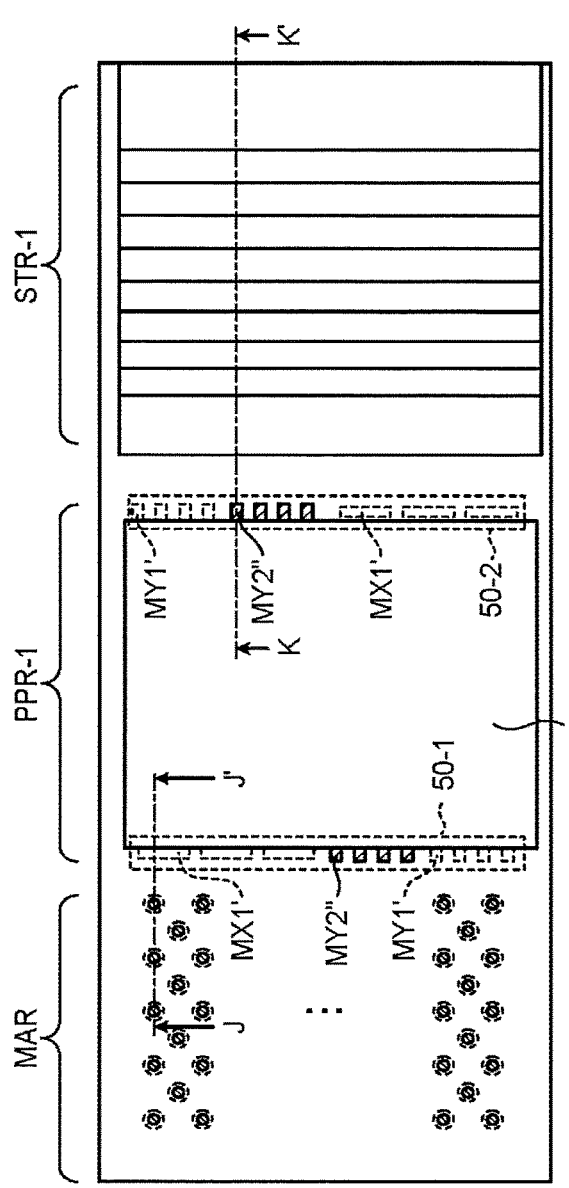
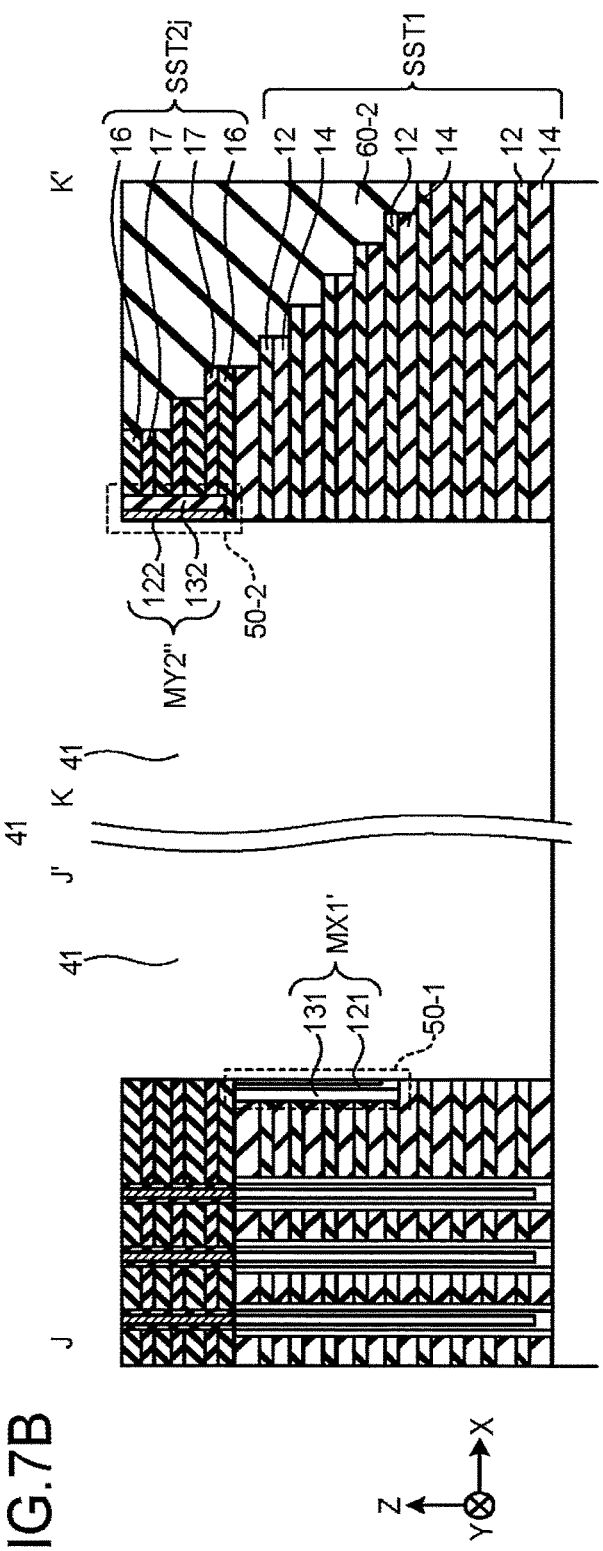
FIG.7A
FIG.7B

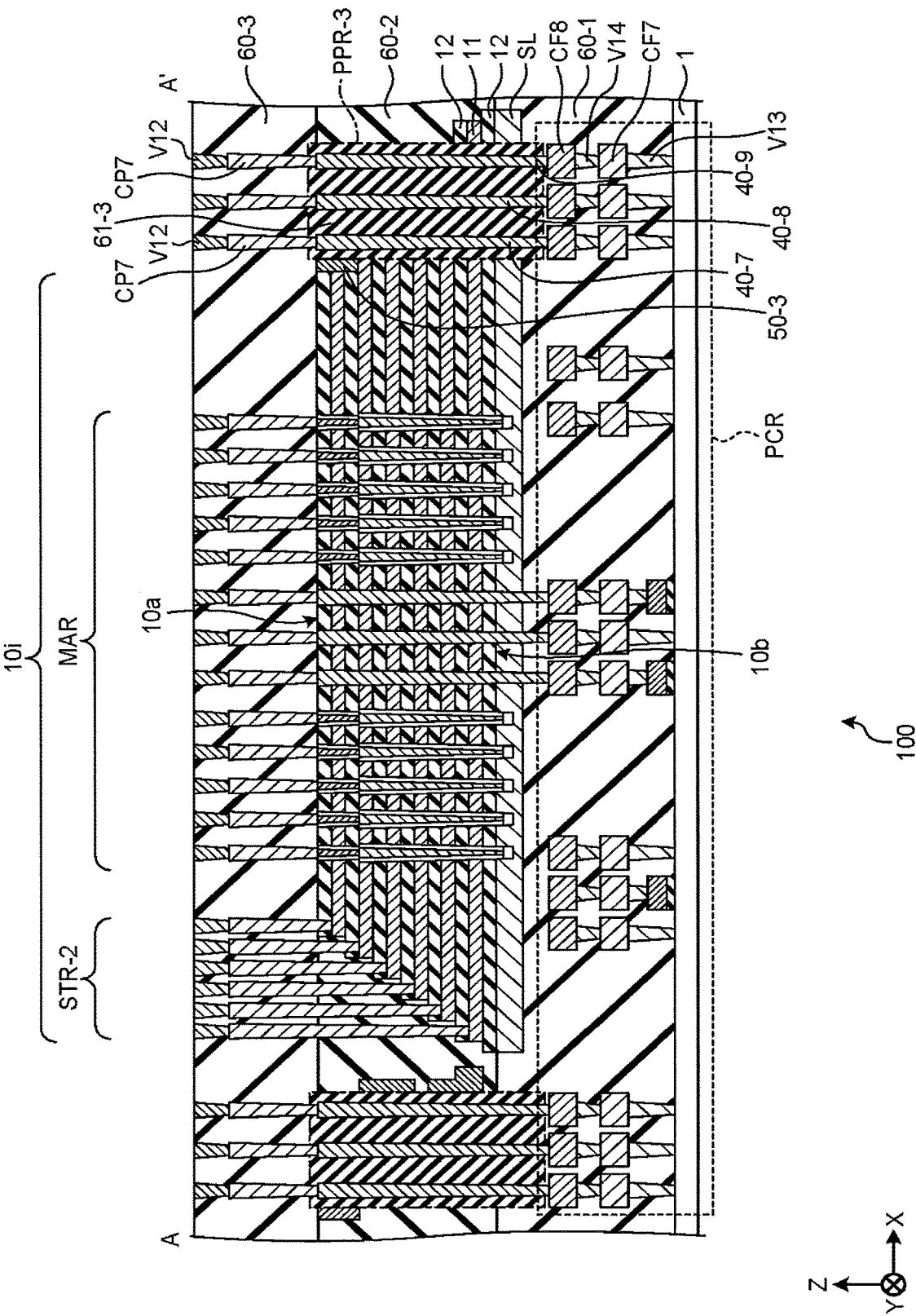

FIG.13A
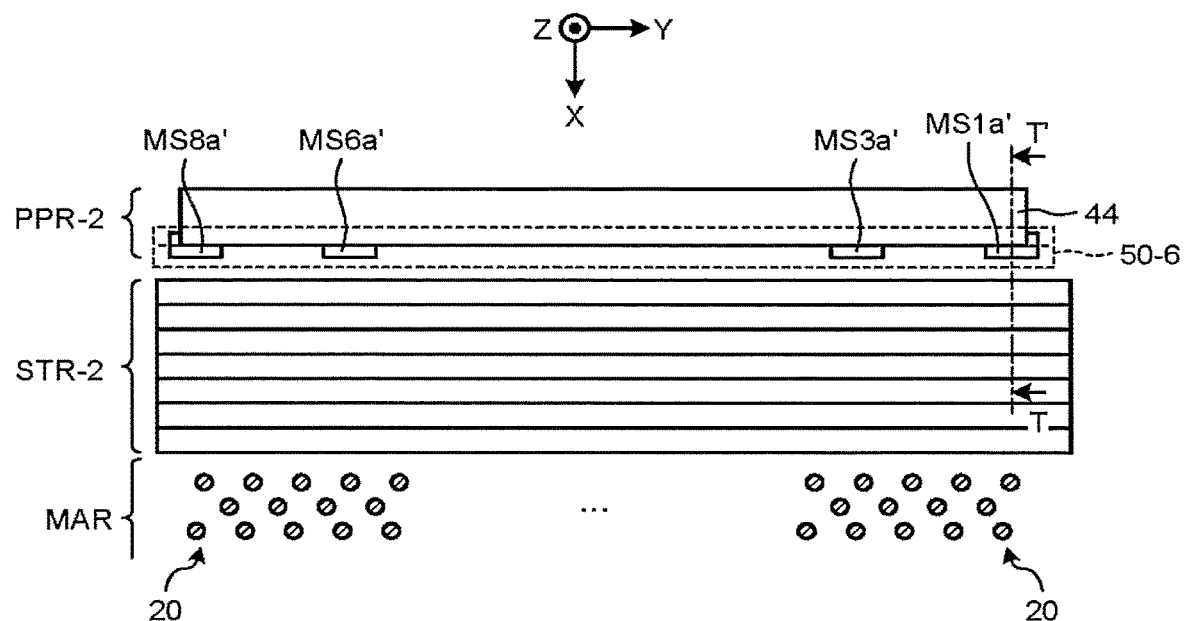
FIG.13B
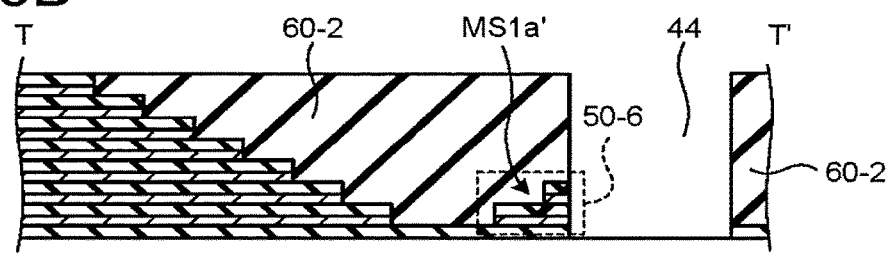
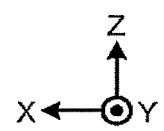

US 10,777,574 B2

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from Japanese Patent Application No. 2018-175366, filed on Sep. 19, 2018; the entire contents of which are incorporated herein by reference.

FIELD

Embodiments described herein relate generally to a semiconductor device and a method of manufacturing a semiconductor device.

BACKGROUND

A semiconductor device may include a stacked body and a semiconductor columnar member that penetrates the stacked body. The stacked body includes a conductive film and an insulating film alternately disposed. It is desirable to increase the number of layers of the stacked body to achieve higher integration of the semiconductor device.

BRIEF DESCRIPTION OF THE DRAWINGS

FIGS. 4A and 4B are a plan view and a cross-sectional view illustrating a method of manufacturing the semiconductor device according to the embodiment;

FIGS. 5A and 5B are a plan view and a cross-sectional view illustrating a method of manufacturing the semiconductor device according to the embodiment;

FIGS. 6A and 6B are a plan view and a cross-sectional view illustrating a method of manufacturing the semiconductor device according to the embodiment;

FIGS. 7A and 7B are a plan view and a cross-sectional view illustrating a method of manufacturing the semiconductor device according to the embodiment;

FIG. 8 is a cross-sectional view illustrating the configuration of a semiconductor device according to a first modification of the embodiment;

FIGS. 13A and 13B are a plan view and a cross-sectional view illustrating a method of manufacturing the semiconductor device according to the third modification of the embodiment.

DETAILED DESCRIPTION

Figure 1:
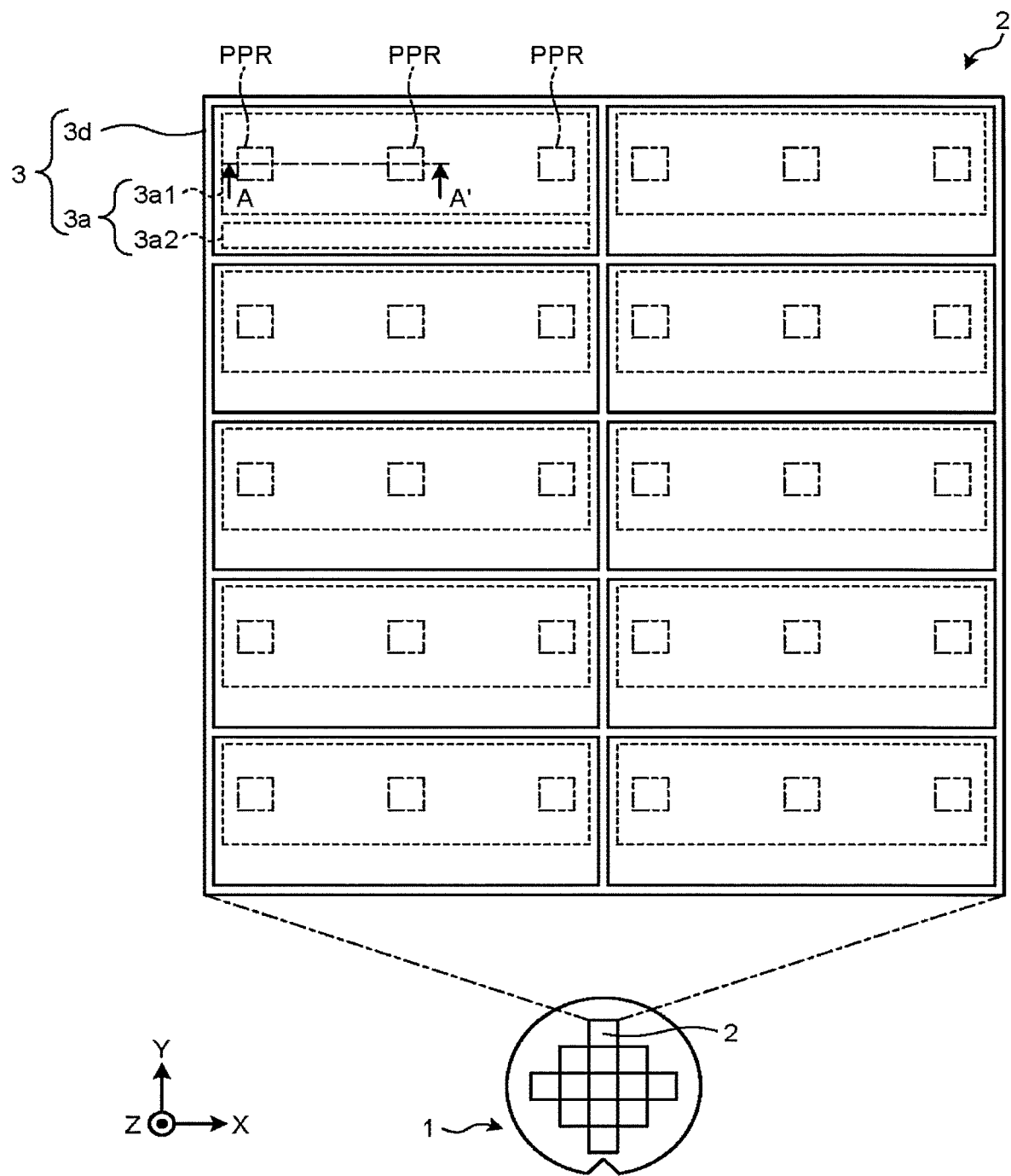
FIG. 1 is a plan view illustrating the configuration of a substrate, a shot region, and a chip region according to an embodiment.

In general, according to one embodiment, there is provided a semiconductor device including a stacked body, a semiconductor columnar member, an insulating film, and a pattern. The stacked body is disposed above a substrate. The stacked body includes a conductive film and an insulating layer alternately disposed in a stacking direction. The semiconductor columnar member penetrates the stacked body in the stacking direction. The insulating film surrounds the semiconductor columnar member. The insulating film penetrates the stacked body in the stacking direction. The pattern is disposed at a position adjacent to or close to a region including a penetration plug. The penetration plug extends from a position same as or above an upper end of the stacked body to a position below a lower end of the stacked body in the stacking direction. The pattern has a quadrangular or disjoined quadrangular shape.

Exemplary embodiments of a semiconductor device will be explained below in detail with reference to the accompanying drawings. The present invention is not limited to the following embodiments.

Embodiment

In the manufacturing process of a semiconductor device, a plurality of layers is stacked above a substrate (for example, a semiconductor substrate). In each layer, device patterns and alignment marks are formed in each shot region. A semiconductor circuit is formed on the substrate by stacking the device patterns of the respective layers. In the exposure process of a semiconductor device, in order to determine the pattern transfer position to the upper layer before pattern formation, an alignment inspection is performed by measuring a reference position with respect to the transfer position, using the alignment mark of the lower layer. In the inspection process of a semiconductor device, in order to inspect the upper and lower layers for proper overlaying, an overlay inspection is performed by measuring the amount of misalignment between the upper and lower layers, using the alignment marks of the upper and lower layers. For appropriate process control, it is desirable to accurately measure the reference position and the amount of misalignment between the upper and lower layers.

A semiconductor device may include a three-dimensional memory. The three-dimensional memory includes a stacked body, which includes a conductive film and an insulating layer alternately disposed, a semiconductor columnar member, and an insulating film covering the side surface of the semiconductor columnar member. The insulating film and the semiconductor columnar member penetrate the stacked body. In the semiconductor device, it is possible to increase the storage capacity by increasing the number of stacked layers. Therefore, since it is possible to reduce the necessity to use a more advanced patterning technique, it is possible to easily reduce the cost per bit. In the three-dimensional memory, the intersection between the conductive layer and the semiconductor columnar member crossing each other functions as a memory cell, and a plurality of memory cells is three-dimensionally arranged to form a memory cell array region. In addition, in order to achieve higher integration of a semiconductor device, the semiconductor device may have a CMOS under array (CUA) structure including a peripheral circuit region under a memory cell array region.

Due to increase in the number of the conductive layers of the stacked body in order to increase the storage capacity, film stress is likely to occur in a region including the stacked body. Film stress may cause positional deviation of the device patterns, resulting in differences in the amounts of misalignment between the layers.

For example, due to the difference in film configuration between the stacked body and the peripheral region thereof, the stress difference for each chip region within the shot region may be increased, and the amount of positional deviation of the pattern or the amount of misalignment between layers can be different between the stacked body and the peripheral region thereof in the chip region. In this situation, if the alignment mark is disposed in a dicing region farther from the stacked body than the peripheral region, the positional deviation of the alignment mark is likely to be different from the positional deviation of the device pattern in the stacked body. In addition, the measurement accuracy of the reference position and the misalignment amount easily increases as the number of patterns included in the alignment mark increases. However, in the dicing region, since the area where the alignment mark can be disposed is limited, it is difficult to increase the number of patterns included in the alignment mark. Thus, in a case where the alignment mark is disposed in the dicing region, the measurement accuracy of the reference position with respect to pattern transfer to the upper layer may lower, and the measurement accuracy of the amount of misalignment between the upper and lower layers may lower.

On the other hand, if the chip region includes a dedicated region for the alignment mark in the periphery of the stacked body, the area of the chip region may increase, increasing the cost of the semiconductor device.

In view of this, in the embodiment, in the semiconductor device having the CUA structure, most of the alignment marks of the upper and lower layers are disposed in a region where a penetration plug, extending from the position same as or above the upper end of the stacked body to a position below the lower end of the stacked body is to be formed within the chip region, and most of the alignment marks are removed at the time of forming a penetration plug. As a result, while shortening the distance between the alignment mark and the memory cell array region without a dedicated region for the alignment mark, both of improvement in the measurement accuracy and cost reduction with respect to an inspection of the reference position and the misalignment amount can be achieved.

Specifically, in the manufacturing process of a semiconductor device, a plurality of layers L1 and L2 is stacked on a substrate 1 illustrated in FIG. 1. FIG. 1 is a plan view illustrating the configuration of a substrate, a shot region, and a chip region in the embodiment. In addition, in the following description, it is assumed that a direction approximately perpendicular to the surface of the substrate 1 is a Z direction and two directions perpendicular to each other within a plane perpendicular to the Z direction are an X direction and a Y direction. In addition, it is assumed that a stacked body forming the main part of the semiconductor device is formed on the +Z side of the substrate 2.

A shot region 2 illustrated in FIG. 1 includes a plurality of chip regions 3. Each chip region 3 includes a device region 3a and a dicing region 3d. The device region 3a includes a main region 3a1 and a peripheral region 3a2. The peripheral region 3a2 is a region where at least a part of the peripheral circuit is disposed. In addition, in the semiconductor device having the CUA structure, the peripheral region 3a2 may be omitted. In the main region 3a1, the main elements of the semiconductor device, such as a stacked body, a semiconductor columnar member, and an insulating film, are disposed. The main region 3a1 includes a plug region PPR. The plug region PPR is a region where a penetration plug is disposed. The main region 3a1 may also include a plurality of plug regions PPR.

In the manufacturing process of a semiconductor device, forming a penetration plug comes after forming device patterns, such as a stacked body, a semiconductor columnar member, and an insulating film. Specifically, in the manufacturing process of a semiconductor device, a device pattern of the layer L1 and an alignment mark of the layer L1 are simultaneously formed, and then a device pattern of the layer L2 and an alignment mark of the layer L2 are simultaneously formed. In this case, at least a part of each of the alignment marks of the layers L1 and L2 is disposed in the plug region PPR. Then, to create the opening for the plug region PPR for forming a penetration plug, the alignment mark of the layer L1 and a pattern as a by-product of the alignment mark of the layer L2 (hereinafter, referred to as a pattern corresponding to the alignment mark of the layer L2 or simply referred to as a corresponding pattern) can be partially removed. For this reason, the semiconductor device has remnants (process-residue patterns) of alignment marks or corresponding patterns thereof at positions adjacent to or close to the plug region PPR.

Figure 2:
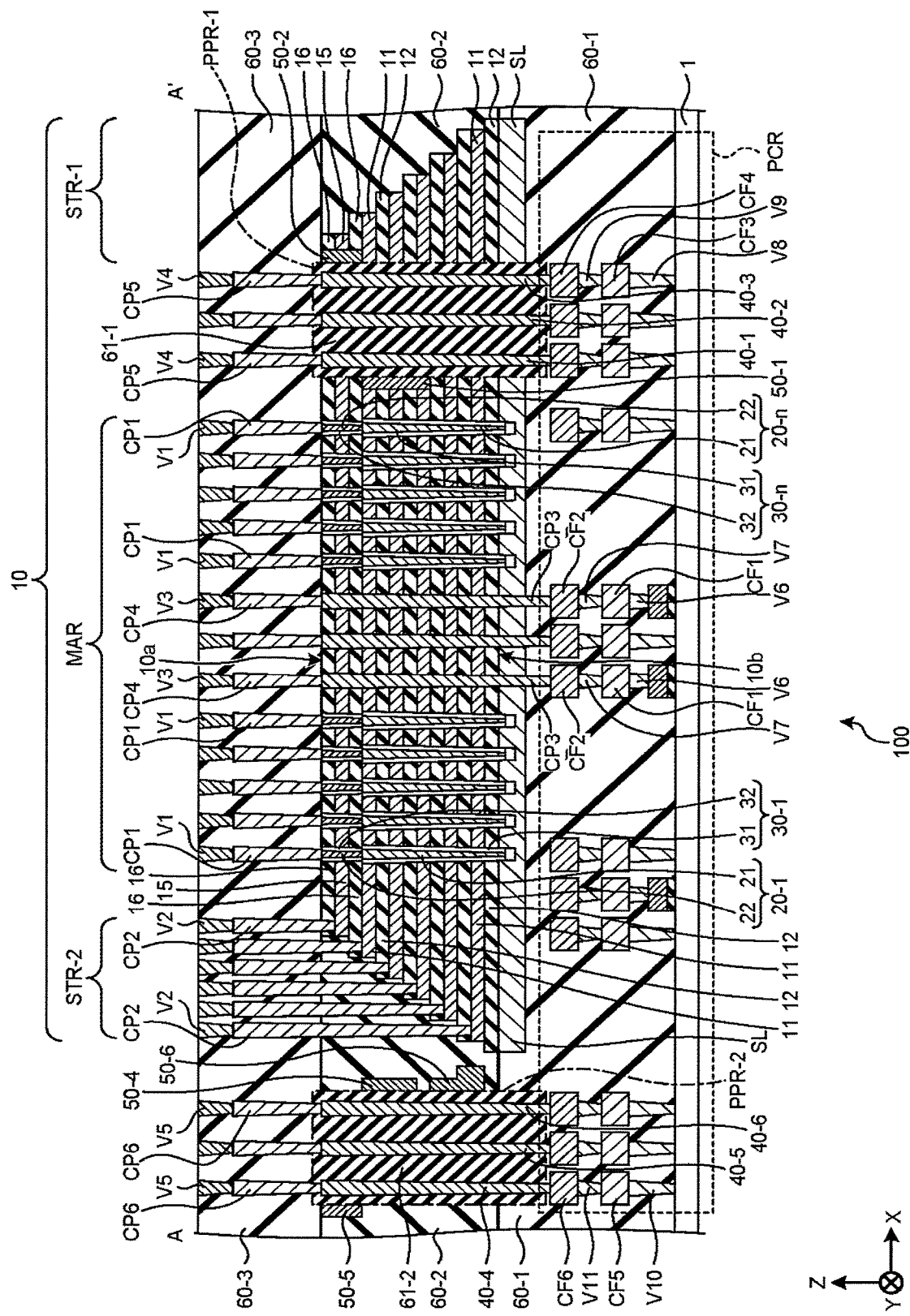
FIG. 2 is a cross-sectional view illustrating the configuration of a semiconductor device according to the embodiment.

For example, a semiconductor device 100 is configured as illustrated in FIG. 2. FIG. 2 is a cross-sectional view illustrating the configuration of the semiconductor device 100. In addition, the semiconductor device 100 may be a device including one chip region 3 illustrated in FIG. 1, or may be a device including a plurality of chip regions 3 illustrated in FIG. 1.

The semiconductor device 100 includes a stacked body 10, semiconductor columnar members 20-1 to 20-n, insulating films 30-1 to 30-n, penetration plugs 40-1 to 40-6, and process-residue pattern groups 50-1, 50-2, 50-4, 50-5, and 50-6. In addition, the semiconductor device 100 may include another stacked body at a position adjacent to the +X side.

The stacked body 10 is disposed above the substrate 1 (on the +Z side). The semiconductor columnar members 20-1 to 20-n penetrate the stacked body 10 in the stacking direction (Z direction). The insulating films 30-1 to 30-n correspond to the semiconductor columnar members 20-1 to 20-n. Each insulating film 30 surrounds the corresponding semiconductor columnar member 20 in an XY plane view. For example, each insulating film 30 covers the side surface of the corresponding semiconductor columnar member 20. The insulating films 30-1 to 30-n extend in the stacking direction (Z direction). Interlayer insulating films 60-1 to 60-3 are disposed around the stacked body 10. The interlayer insulating film 60-3 is disposed at a position on the +Z side of a +Z side end 10a of the stacked body 10, the interlayer insulating film 60-2 is disposed at a position between the +Z side end 10a and a −Z side end 10b of the stacked body 10, and the interlayer insulating film 60-1 is disposed at a position on the −Z side of the −Z side end 10b of the stacked body 10.

Each semiconductor columnar member 20 includes a semiconductor columnar member 21 and a semiconductor columnar member 22, and the semiconductor columnar member 21 and the semiconductor columnar member 22 are stacked in order in the Z direction and can be electrically connected to each other. The semiconductor columnar member 21 is formed of a material containing semiconductor (for example, polysilicon) as a main component, and can function as a channel region for a memory cell. The semiconductor columnar member 22 is formed of a material containing semiconductor (for example, polysilicon) as a main component, and can function as a channel region for a selection transistor. The semiconductor columnar member 21 and the semiconductor columnar member 22 are formed, for example, in an approximately cylindrical shape extending in the Z direction, and a core insulating film can be disposed inside each of the semiconductor columnar member 21 and the semiconductor columnar member 22. The diameter of the semiconductor columnar member 22 may be smaller than the diameter of the semiconductor columnar member 21.

Each insulating film 30 includes an insulating film 31 and an insulating film 32, and the insulating film 31 and the insulating film 32 are stacked in order in the Z direction. The insulating film 31 covers the side surface of the semiconductor columnar member 21, is formed as a multilayer film (for example, silicon oxide film/silicon nitride film/silicon oxide film), and can function as an insulating film for a memory cell. The insulating film 32 covers the side surface of the semiconductor columnar member 22, is formed as a single layer film (for example, a silicon oxide film), and can function as an insulating film for a selection transistor. In addition, the insulating film 32 may also be formed as a multilayer film (for example, silicon oxide film/silicon nitride film/silicon oxide film).

The stacked body 10 includes a memory cell array region MAR and staircase regions STR-1 and STR-2. The staircase region STR-1 is disposed on the +X side of the memory cell array region MAR, and the staircase region STR-2 is disposed on the −X side of the memory cell array region MAR.

The plug regions PPR-1 and PPR-2 are located around the memory cell array region MAR. The plug region PPR-1 is disposed between the memory cell array region MAR and the staircase region STR-1 of the stacked body 10. Penetration plugs 40-1 to 40-3 are disposed in the plug region PPR-1. The plug region PPR-2 is disposed on the −X side of the memory cell array region MAR and the staircase region STR-2 of the stacked body 10, and is disposed adjacent to the staircase region STR-2. Penetration plugs 40-4 to 40-6 are disposed in the plug region PPR-2.

In the memory cell array region MAR of the stacked body 10, a conductive film 11 and an insulating layer 12 are alternately disposed in the stacking direction (Z direction), the intersection between the conductive film 11 and the semiconductor columnar member 21 functions as a memory cell, and the memory cells are arranged in a three-dimensional manner. A part of the conductive film 11 crossing the semiconductor columnar member 21 can function as a control gate in a memory cell, and the remaining part of the conductive film 11 can function as a word line for transmitting a signal to the control gate. In addition, the intersection between the semiconductor columnar member 21 and at least one of the conductive films 11 including the lowermost conductive film 11 may function as a selection transistor on the source side.

In the stacked body 10, at least one conductive film 15 and at least one insulating layer 16 are disposed alternately in the stacking direction (Z direction), and the intersection between the conductive film 15 and the semiconductor columnar member 22 functions as a selection transistor on the drain side. This can ensure selective access to the memory cell. A part of the conductive film 15 crossing the semiconductor columnar member 22 can function as a selection gate in the selection transistor, and the remaining part of the conductive film 15 can function as a selection control line for transmitting a signal to the selection gate.

In the stacked body 10, a staircase structure is disposed in the staircase region STR. The staircase structure is a structure in which the conductive films 11 and the conductive film 15 are drawn out in a stepwise manner from the memory array region MAR to the outside, in order to improve the accessibility to the three-dimensional memory cell array region MAR. Then, the stacked body 10 is configured such that, in the staircase region STR-2, a plurality of contact plugs CP2 extending in a depth direction at different depths from predetermined wiring layer are connected to the plurality of conductive films 11 and the conductive film 15 that are drawn out in a stepwise manner. Each contact plug CP2 is connected to upper layer wiring (not illustrated) through a via plug V2.

In addition, for the memory cell array region MAR, access to each memory cell can be made through the wiring structure drawn out in the +Z direction from the plurality of conductive films 11 and the conductive film 15 having the above-described staircase shape and wiring (that is, a contact plug CP1, a via plug V1, and upper layer wiring (not illustrated)) drawn out in the +Z direction from each semiconductor columnar member 20. However, a control circuit for controlling each memory cell is disposed in a peripheral circuit region PCR below the stacked body 10 (on the −Z side). For this reason, a penetration contact CP3 and the penetration plugs 40-1 to 40-6 extending from the position same as or above the upper end 10a of the stacked body 10 to a position below the lower end 10b of the stacked body 10 are provided.

For example, each of the penetration plugs 40-1 to 40-3 extends from the same Z-directional position as the +Z side end 10a of the stacked body 10 or from a position on the +Z side of the +Z side end 10a to a position on the −Z side of the −Z side end 10b and penetrates an insulating film 61-1 and the stacked body 10 (FIG. 2 shows an example that the penetration plugs 40-1 to 40-3 extend from the same Z-directional position as the +Z side end 10a of the stacked body 10 to a position on the −Z side of the −Z side end 10b). The insulating film 61-1 is selectively embedded in the plug region PPR-1 separately from the interlayer insulating films 60-1 to 60-3. In addition, each of the penetration plugs 40-1 to 40-3 penetrates a lower conductive layer SL of the stacked body 10 to reach a conductive film CF4 in the peripheral circuit region PCR. The conductive layer SL functions as a source line in a three-dimensional memory, and is connected to the lower end of the semiconductor columnar member 20 penetrating the stacked body 10 in the Z direction. Each of the penetration plugs 40-1 to 40-3 and the stacked body 10 and the conductive layer SL are insulated from each other by the insulating film 61-1 disposed so as to surround the peripheries of the penetration plugs 40-1 to 40-3 in an XY cross section view. As illustrated in FIG. 2, signals can be transmitted and received between the upper layer wiring (not illustrated) and the control circuit through a plug V4, a contact CP5, the penetration plug 40-1 (or 40-2 or 40-3), the conductive film CF4, a plug V9, a conductive film CF3, and a plug V8. In addition, the number of plugs or contacts disposed between the upper layer wiring (not illustrated) and the control circuit is not limited to the above. For example, the contact CP5 and the penetration plug 40-1 (or 40-2 or 40-3) may be integrated to provide a plug extending from a position on the +Z side of the +Z side end 10*a* of the stacked body 10 to a position on the −Z side of the −Z side end 10*b*.

In addition, each of the penetration plugs 40-4 to 40-6 extends from the same Z-directional position as the +Z side end 10*a* of the stacked body 10 or from a position on the +Z side of the +Z side end 10*a* to a position on the −Z side of the −Z side end 10*b* and penetrates an insulating film 61-2 (in FIG. 2, a case is exemplified in which the penetration plugs 40-4 to 40-6 extend from the same Z-directional position as the +Z side end 10*a* of the stacked body 10 to a position on the −Z side of the −Z side end 10*b*). The insulating film 61-2 is selectively embedded in the plug region PPR-2 separately from the interlayer insulating films 60-1 to 60-3. In addition, each of the penetration plugs 40-4 to 40-6 reaches a conductive film CF6 in the peripheral circuit region PCR. The penetration plugs 40-4 to 40-6 are insulated from each other by the insulating film 61-2 disposed so as to surround the peripheries of the penetration plugs 40-4 to 40-6 in the XY cross section view. As illustrated in FIG. 2, signals can be transmitted and received between the upper layer wiring (not illustrated) and the control circuit through a plug V5, a contact CP6, the penetration plug 40-4 (or 40-5 or 40-6), the conductive film CF6, a plug V11, a conductive film CF5, and a plug V10. Also in this case, the number of plugs or contacts between the upper layer wiring (not illustrated) and the control circuit is not limited to the above number as with the plug region PPR-1 described above.

In addition, the penetration contact CP3 extends from the same Z-directional position as the +Z side end 10*a* of the stacked body 10 or from a position on the +Z side of the +Z side end 10*a* to a position on the −Z side of the −Z side end 10*b* and penetrates the stacked body 10 (FIG. 2 shows an example that the penetration contact CP3 extends from the same Z-directional position as the +Z side end 10*a* of the stacked body 10 to a position on the −Z side of the −Z side end 10*b*). In addition, the penetration contact CP3 penetrates the lower conductive layer SL of the stacked body 10 to reach a conductive film CF2 in the peripheral circuit region PCR. The penetration contact CP3 and the stacked body 10 and the conductive layer SL are insulated from each other by an insulating film (not illustrated) disposed so as to surround the periphery of the penetration contact CP3 in the XY cross section view. As illustrated in FIG. 2, transmission and reception of signals from the upper layer wiring (not illustrated) to the control circuit can be performed through a plug V3, a contact CP4, the penetration contact CP3, the conductive film CF2, a plug V7, a conductive film CF1, and a plug V6. Also in this case, the point that the number of plugs or contacts disposed between the upper layer wiring (not illustrated) and the control circuit is not limited to the above is the same as in the cases of the plug regions PPR-1 and PPR-2 described above. In addition, a penetration contact CP3' (not illustrated) similar to the penetration contact CP3 may be disposed in the staircase region STR-1. In this case, the penetration contact CP3' extends from a position on the +Z side of the +Z side end 10*a* to a position on the −Z side of the −Z side end 10*b* of the stacked body 10 and penetrates the staircase structure of the staircase region STR-1. In addition, the penetration contact CP3' penetrates the lower conductive layer SL of the stacked body 10 to reach a conductive film (not illustrated) in the peripheral circuit region PCR.

In addition, signals are transmitted and received from the upper layer wiring (not illustrated) to the conductive film 11 through the plug V2 and the contact CP2, and from the upper layer wiring (not illustrated) as a bit line in the three-dimensional memory to the semiconductor columnar member 20 through the plug V1 and the contact CP1. In addition, in the XY cross section view, the periphery of the semiconductor columnar member 20 is surrounded by the approximately cylindrical insulating film 30 having a charge storage capability. The semiconductor columnar member 20 may have a structure including a core insulating film inside.

The process-residue pattern groups 50-1 and 50-2 are disposed at positions adjacent to or close to the plug region PPR-1.

For example, the process-residue pattern group 50-1 is disposed at a position adjacent to or close to the −X side with respect to the plug region PPR-1. The process-residue pattern group 50-1 includes remnants (process-residue patterns) of alignment marks formed at the same time when the semiconductor columnar member 21 (or 22) is formed. Each process-residue pattern has a quadrangular or disjoined quadrangular shape in the XY plane view (refer to FIG. 7A). In each process-residue pattern, a +Z side end has a Z height corresponding to the +Z side end of the semiconductor columnar member 21 (or 22).

In addition, in this specification, examples of the quadrangular shape include not only mathematical quadrangles but also shapes with slightly rounded or chamfered corners due to process factors that are recognizable generally as a quadrangle.

The process-residue pattern group 50-2 is disposed at a position adjacent to or close to the +X side with respect to the plug region PPR-1. The process-residue pattern group 50-2 includes a plurality of remnants (process-residue patterns) of alignment marks formed at the same time when the semiconductor columnar member 22 (or 21) is formed. Each process-residue pattern has a quadrangular or disjoined quadrangular shape, in the XY plane view. In each process-residue pattern, a +Z side end has a Z height corresponding to the +Z side end of the semiconductor columnar member 22 (or 21).

For example, the process-residue pattern groups 50-1 and 50-2 disposed at positions adjacent to or close to the plug region PPR-1 can be formed by manufacturing the semiconductor device 100 as illustrated in FIGS. 2 and 3A to 7B. FIGS. 3A, 4A, 5A, 6A, and 7A are plan views illustrating a method of manufacturing the semiconductor device 100. FIGS. 3B, 4B, 5B, 6B, and 7B are cross-sectional views illustrating the method of manufacturing the semiconductor device 100. In FIG. 3B, an enlarged cross section of the configuration illustrated in FIG. 3A taken along B-B' line on the left side, and an enlarged cross section of the configuration illustrated in FIG. 3A taken along C-C' line on the right side. In FIG. 4B, an enlarged cross section of the configuration illustrated in FIG. 4A taken along D-D' line on the left side, and an enlarged cross section of the configuration illustrated in FIG. 4A taken along E-E' line on the right side. In FIG. 5B, an enlarged cross section of the configuration illustrated in FIG. 5A taken along F-F' line on the left side, and an enlarged cross section of the configuration illustrated in FIG. 5A taken along with G-G' line on the right side. In FIG. 6B, an enlarged cross section of the configuration illustrated in FIG. 6A taken along H-H' line on the left side, and an enlarged cross section of the configuration illustrated in FIG. 6A taken along I-I' line on the right side. In FIG. 7B, an enlarged cross section of the configuration illustrated in FIG. 7A taken along J-J' line on the left side, and an enlarged cross section of the configuration illustrated in FIG. 7A taken along K-K' line on the right side. FIGS. 3B, 4B, 5B, 6B, and 7B omit illustrating the peripheral circuit region PCR below the stacked body for the sake of simplicity. FIG. 2 is a cross-sectional view illustrating the configuration of the semiconductor device 100, and is also used for illustrating a method of manufacturing the semiconductor device 100.

Figure 3A:
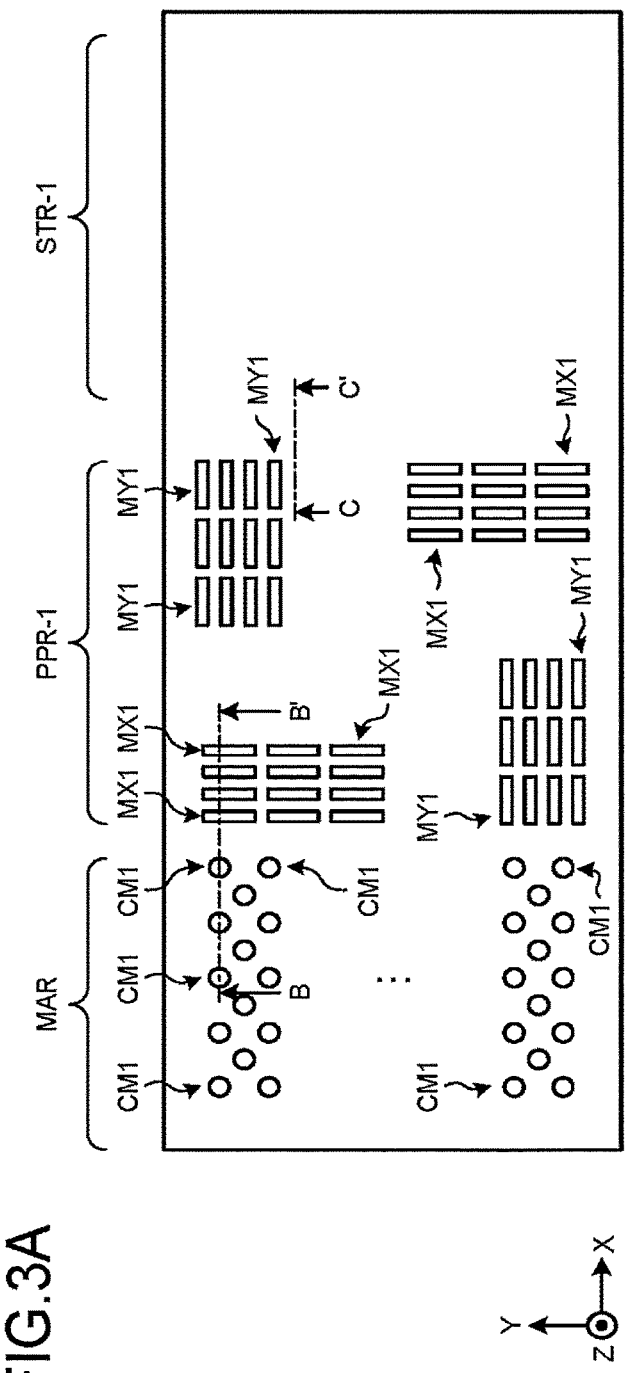
FIGS. 3A and 3B are a plan view and a cross-sectional view illustrating a method of manufacturing the semiconductor device according to the embodiment.
Figure 3B:
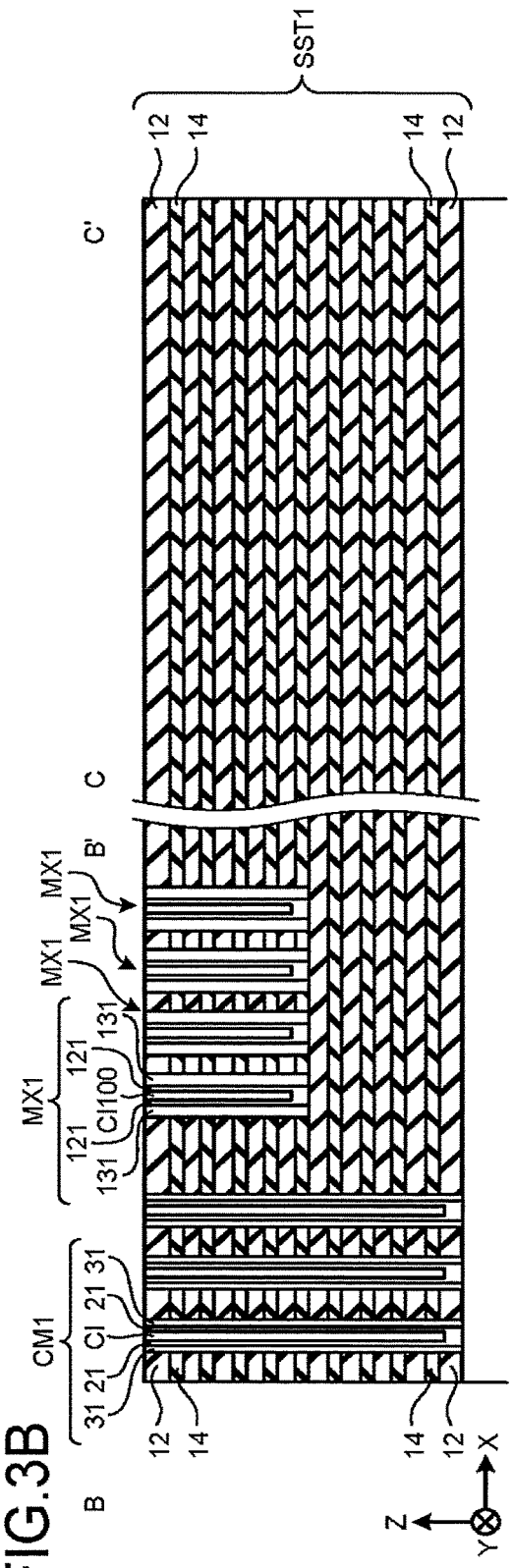

In the step illustrated in FIGS. 3A and 3B, a transistor is formed on the surface of the substrate 1, and a contact plug, a wiring film, and a via plug are formed on the substrate 1 and an interlayer insulating film is formed around the contact plug, the wiring film, and the via plug. In this manner, an integrated circuit is formed in the peripheral circuit region PCR (refer to FIG. 2).

Then, a conductive layer as a source line is formed. The conductive layer can be formed by sequentially depositing and patterning a lower layer and an upper layer. The lower layer can be formed of a material containing a metal (for example, tungsten) as a main component. The upper layer can be formed of a material containing a semiconductor to which conductivity is given (for example, amorphous silicon containing impurities) as a main component. An insulating film is formed around the patterned conductive layer as a source line, and the interlayer insulating film 60-1 (refer to FIG. 2) is formed together with an interlayer insulating film in the peripheral circuit region PCR.

A stacked structure SST1 is formed by alternately depositing the insulating layer (for example, a silicon oxide film) 12 and a sacrificial film (for example, a silicon nitride film) 14 multiple times. A resist pattern with openings at the formation position of a columnar body CM1 in the memory cell array region MAR and at the formation positions of alignment marks MX1 and MY1 in the plug region PPR-1 are formed on the stacked structure, as illustrated in FIG. 3A. A memory hole in the memory cell array region MAR and holes for the alignment marks MX1 and MY1 in the plug region PPR-1 are formed by anisotropic etching, such as reactive ion etching (RIE), using the resist pattern as a mask.

In this case, the hole for the alignment mark MX1 can be formed so as to have an approximate line shape extending in the Y direction in the XY plane view, and the hole for the alignment mark MY1 can be formed in an approximate linear shape extending in the X direction in the XY plane view.

Then, an oxide film (for example, a silicon oxide film or an aluminum oxide film), a nitride film (for example, a silicon nitride film), and an oxide film (for example, a silicon oxide film) are sequentially deposited on the side and bottom surfaces of the memory hole to form the insulating film 31, and the bottom surface of the insulating film 31 is selectively removed. Thereafter, a semiconductor film (for example, a polysilicon film) is deposited to form the semiconductor columnar member 21. At the same time, an oxide film (for example, alumina), a nitride film (for example, a silicon nitride film), and an oxide film (for example, a silicon oxide film) are sequentially deposited on the side and bottom surfaces of the holes for the alignment marks MX1 and MY1 to form an insulating layer 131, and the bottom surface of the insulating layer 131 is selectively removed. Thereafter, a semiconductor film (for example, a polysilicon film) is deposited to form a semiconductor layer 121. In addition, a core insulating layer CI may be embedded in the memory hole, and a core insulating layer CI100 may be embedded in the holes for the alignment marks MX1 and MY1.

As a result, columnar bodies CM1 are formed in the memory cell array region MAR, and alignment marks MX1 and MY1 are formed in the plug region PPR-1.

In this case, the alignment mark MX1 can be formed in an approximate linear shape extending in the Y direction in the XY plane view, and the alignment mark MY1 can be formed so as to have an approximate line shape extending in the X direction in the XY plane view. In addition, although FIG. 3 illustrates the example that the −Z side end of the alignment mark MX1 is higher in the Z height than the −Z side end of the columnar body CM1, the −Z side end of the alignment mark MX1 may have the same Z height as the −Z side end of the columnar body CM1.

In the step illustrated in FIGS. 4A and 4B, a stacked structure SST2 is formed by alternately stacking the insulating layer 16 and a sacrificial film 17 multiple times on the stacked structure SST1. Then, a resist film RF that covers the +Z side surface of the stacked structure SST2 is formed.

In this case, a position measurement unit of an exposure apparatus performs an alignment inspection for measuring (detecting) a reference position for determining a pattern transfer position to the resist film RF before the pattern formation, using alignment marks MX1 and MY1. For example, the center position of the plurality of alignment marks MX1 in the X direction is calculated using the plurality of alignment marks MX1, and the center position of the plurality of alignment marks MY1 in the Y direction is calculated using the plurality of alignment marks MY1. Using the center positions of the plurality of alignment marks MX1 and MY1, the reference position of the substrate on the stage of the exposure apparatus is detected. By using the detected reference position, as illustrated by the two-dot chain line in FIG. 4B, a formation position $FP_{CH2}$ of a hole CH2 corresponding to a columnar body CM2 of the memory cell array region MAR to be transferred to the resist film RF and formation positions $FP_{MX2}$ and $FP_{MY2}$ ($FP_{MX2}$ is omitted in FIG. 4B) of alignment marks MX2 and MY2 in the plug region PPR-1 are determined. Then, the resist film RF is exposed by the exposure unit of the exposure apparatus, so that a latent image of the pattern is formed at the determined formation position.

In the step illustrated in FIGS. 5A and 5B, a developing apparatus develops the latent image on the resist film RF. As a result, a resist pattern RP including the hole CH2 corresponding to the formation position of the columnar body CM2 in the memory cell array region MAR and the alignment marks MX2 and MY2 in the plug region PPR-1 is formed on the stacked structure SST2.

In this case, the hole CH2 is formed so as to overlap with the memory hole in the XY plane view and be smaller diameter than the memory hole. The alignment mark MX2 can be formed so as to have a linear shape extending in the Y direction in the XY plane view, and the alignment mark MY2 can be formed in a linear shape extending in the X direction in the XY plane view.

Then, using the alignment marks MX1 and MY1 and the alignment marks MX2 and MY2, an overlay inspection is performed to measure the amount of overlay misalignment between the formation positions of the plurality of columnar bodies CM1 and the formation positions of the plurality of holes CH2. For example, using the alignment mark MX1 and the alignment mark MX2, the amount of misalignment in the X direction between the formation position of the columnar body CM1 and the formation position of the hole CH2 is evaluated. Using the alignment mark MY1 and the alignment mark MY2, the amount of misalignment in the Y direction between the formation position of the columnar body CM1 and the formation position of the hole CH2 is evaluated. In addition, the amount of overlay misalignment may be evaluated using an overlay inspection function of the exposure apparatus or by an overlay inspection apparatus.

If the amount of overlay misalignment between the formation positions of columnar bodies CM1 and the formation positions of holes CH2 is not within the allowable range, the resist pattern RP is peeled off and the step illustrated in FIGS. 4A and 4B and the step illustrated in FIGS. 5A and 5B are performed again.

On the other hand, if the amount of overlay misalignment between the formation positions of the columnar bodies CM1 and the formation positions of the holes CH2 is within the allowable range, step illustrated in FIGS. 6A and 6B are performed.

In the step illustrated in FIGS. 6A and 6B, anisotropic etching, such as reactive ion etching (RIE), is performed using the resist pattern RP as a mask. As a result, the hole CH2 and the alignment marks MX2 and MY2 in the resist pattern RP are transferred to the stacked structure SST2. That is, a hole corresponding to the columnar body CM2 is formed in the memory cell array region MAR, and holes corresponding to the alignment marks MX2 and MY2 are formed in the plug region PPR-1.

In this case, the hole corresponding to the columnar body CM2 is formed so as to overlap with the memory hole in the XY plane view and be smaller in diameter than the memory hole. The hole corresponding to the alignment mark MX2 can be formed so as to have a linear shape extending in the Y direction in the XY plane view, and the hole corresponding to the alignment mark MY2 can be formed so as to have a linear shape extending in the X direction in the XY plane view.

Then, an oxide film (for example, a silicon oxide film) is deposited on the side and bottom surfaces of the hole corresponding to the columnar body CM2 to form the insulating film 32, and a portion of the bottom surface in the insulating film 32 is selectively removed. Thereafter, a semiconductor film (for example, a polysilicon film) is deposited to form the semiconductor columnar member 22. At the same time, an oxide film (for example, a silicon oxide film) is deposited on the side and bottom surfaces of the holes corresponding to the alignment marks MX2 and MY2 to form an insulating layer 132, and a portion of the bottom surface in the insulating layer 132 is selectively removed. Thereafter, a semiconductor film (for example, a polysilicon film) is deposited to form a semiconductor layer 122. In addition, although not illustrated, a core insulating layer may be embedded in the hole corresponding to the columnar body CM2, and a core insulating layer may be embedded in the holes corresponding to the alignment marks MX2 and MY2. Alternatively, each of the insulating film 32 and the insulating layer 132 may be formed as a multilayer film by sequentially depositing an oxide film (for example, alumina), a nitride film (for example, a silicon nitride film), and an oxide film (for example, a silicon oxide film) on the side and bottom surfaces of the hole.

As a result, a plurality of columnar bodies CM2 is formed in the memory cell array region MAR, and patterns MX2' and MY2' corresponding to the alignment marks MX2 and MY2 are formed in the plug region PPR-1. In this case, the pattern MX2' can be formed so as to have an approximate linear shape extending in the Y direction in the XY plane view, and the pattern MY2' can be formed so as to have an approximate linear shape extending in the X direction in the XY plane view.

In the step illustrated in FIGS. 7A and 7B, in the staircase regions STR-1 and STR-2 (refer to FIG. 2) in the stacked structures SST1 and SST2$i$ (refer to FIG. 6B), a thick resist pattern (not illustrated) having a predetermined opened region is formed on the stacked structure SST2$i$. Then, a set of the insulating layer 16 and the sacrificial film 17 in a region corresponding to the opening of the resist pattern are etched by the reactive ion etching (RIE). Thereafter, the size of the resist pattern is reduced by slimming. Then, using the resist pattern as a mask, a set of the insulating layer 12 (or 16) and the sacrificial film 14 (or 17) is etched by RIE. Then, the process from the slimming of the resist pattern to the etching of the set of the insulating layer 12 (or 16) and the sacrificial film 14 (or 17) is repeated. As a result, a staircase structure is formed in the staircase region STR-1. In this case, in a ZX cross section view, a second staircase structure having a linear symmetrical structure with respect to the staircase structure of the staircase region STR-1 can be formed on another stacked body adjacent to the +X side of the stacked body 10. Thereafter, the interlayer insulating film 60-2 is formed around the stacked structures SST1 and SST2$j$ in which the staircase structure is formed.

Then, in the plug region PPR-1, a resist pattern (not illustrated) with openings at the formation position of an opening 41 is formed on the stacked structure SST2$j$ and the interlayer insulating film 60-2, as illustrated in FIG. 7A. Anisotropic etching, such as a reactive ion etching (RIE) method, is performed using the resist pattern as a mask to form the opening 41. In addition, the opening 41 can be formed so as to penetrate the stacked structures SST2$j$ and SST1 and further penetrate at least the conductive layer SL thereunder (refer to FIG. 2).

In this case, the alignment marks MX1 and MY1 and the patterns MX2' and MY2' are mostly removed, but partially remain as the process-residue pattern groups 50-1 and 50-2. For example, the process-residue pattern group 50-1 includes a process-residue pattern MX1' of the alignment mark MX1, a process-residue pattern MY1' of the alignment mark MY1, and a process-residue pattern MY2" of the pattern MY2'. The process-residue pattern group 50-2 also includes the process-residue pattern MX1' of the alignment mark MX1, the process-residue pattern MY1' of the alignment mark MY1, and the process-residue pattern MY2" of the pattern MY2'.

In the step illustrated in FIG. 2, in the memory cell array region MAR, a hole for the penetration contact CP3 is formed, and an insulating film is deposited on the side surface of the hole. Then, a conductive material is embedded to form the penetration contact CP3. In this case, in the same manner as mentioned above, a penetration contact similar to the penetration contact CP3 may be formed in the staircase region STR-1. In the plug region PPR-1, the insulating film 61-1 is embedded in the opening 41, and a resist pattern with openings at the formation positions of the penetration plugs 40-1 to 40-3 is formed on the insulating film 61-1. Similarly, the insulating film 61-2 is embedded in the opening formed in the plug region PPR-2, and a resist pattern with openings at the formation positions of the penetration plugs 40-4 to 40-6 is formed on the insulating film 61-2. In the insulating films 61-1 and 61-2, a hole, which extends from the same Z-directional position as the +Z side end 10$a$ of the stacked body 10 or from a position on the +Z side of the +Z side end 10$a$ to a position on the −Z side of the −Z side end 10$b$ of the stacked body 10 is formed by anisotropic etching, such as reactive ion etching (RIE), using the resist pattern as a mask. Then, a conductive material (for example, tungsten) is embedded in the hole to form the penetration plugs 40-1 to 40-3 and 40-4 to 40-6 (FIG. 2 exemplifies that the penetration plugs 40-1 to 40-3 and 40-4 to 40-6 extend from the same Z-directional position as the +Z side end 10$a$ of the stacked body 10 to a position on the −Z side of the −Z side end 10$b$).

Then, a resist pattern, with an opening for forming a slit (separator) extending in the X direction on the +Y side (or −Y side) of the penetration plugs 40-1 to 40-3, is formed on the stacked structure SST2j and the penetration plugs 40-1 to 40-3. By anisotropic etching, such as reactive ion etching (RIE), using the resist pattern as a mask, the stacked structure SST2j and SST1 are divided by the slit into stacked bodies. Thereafter, the sacrificial films 14 and 17 are removed from the stacked bodies of the alternately stacked insulating layer 12 and sacrificial film 14 and of the alternately stacked insulating layer 16 and sacrificial film 17 by isotropic etching, such as wet etching. Then, a conductive material is embedded in a void through the slit, so that the stacked body 10 in which the insulating layer 12 and the conductive film 11 are alternately stacked and the insulating layer 16 and the conductive film 15 are further stacked is formed. Then, an insulating material is embedded in the slit, so that a separator for electrically separating a plurality of stacked bodies 10 from each other is formed. Thereafter, the interlayer insulating film 60-3 is deposited, and the contacts CP1, CP2, and CP4 to CP6, the plugs V1 to V5, and the upper layer wiring (not illustrated) can be formed in order.

In addition, the step of etching the sacrificial film through the slit and embedding the conductive material in the void may be performed before the step of forming the penetration contact CP3 and the penetration plugs 40-1 to 40-3 after the insulating film 61-1 is embedded in the opening 41.

As described above, in the embodiment, in the semiconductor device 100 having the CUA structure, the alignment marks MX1, MY1, MX2, and MY2 of the upper and lower layers L1 and L2 are disposed in the plug region PPR-1 where the penetration plugs 40-1 to 40-3 are to be formed, and the alignment marks MX1, MY1, MX2, and MY2 are partially removed at the time of forming the penetration plugs 40-1 to 40-3. Thus, since the distance between the alignment marks MX1, MY1, MX2, and MY2 and the memory cell array region MAR can be shortened without dedicated regions for the alignment marks MX1, MY1, MX2, and MY2, it is possible to improve the measurement accuracy of the reference position of the pattern transfer and the measurement accuracy of the misalignment amount and to reduce the cost.

In addition, the embodiment has described the example that the alignment marks MX1 and MY1 of the layer L1 are used as an alignment inspection mark for determining the transfer position of the layer L2 and an overlay inspection mark between the layers L1 and L2. However, the alignment inspection mark and the overlay inspection mark may be formed as separate marks.

Alternatively, the alignment marks disposed in the plug region PPR may be alignment marks other than the alignment marks MX1 and MY1 formed at the same time when the semiconductor columnar member 21 is formed and the alignment marks MX2 and MY2 formed at the same time when the semiconductor columnar member 22 is formed. For example, an opening may be formed on the bottom surface after forming the insulating film 31 on the side and bottom surfaces of the memory hole. In this case, an alignment mark corresponding to the opening may be formed in the plug region PPR at the time of forming the opening. Alternatively, at the time of forming a slit (separator) for dividing the stacked structure into a plurality of stacked bodies, an alignment mark corresponding to the slit (separator) may be formed in the plug region PPR. Alternatively, the stacked structure of the conductive film 15 and the insulating layer 16 between the plurality of columnar bodies CM2 illustrated in FIGS. 6A and 6B may be cut in the Z direction. In this case, at the time of forming a cut groove, an alignment mark corresponding to the cut groove may be formed in the plug region PPR. Alternatively, a memory hole may be formed in two steps for a lower memory hole and an upper memory hole. In this case, an alignment mark corresponding to the lower memory hole may be formed in the plug region PPR at the time of forming the lower memory hole, and an alignment mark corresponding to the upper memory hole may be formed in the plug region PPR at the time of forming the upper memory hole.

Alternatively, as a first modification of the embodiment, as illustrated in FIG. 8, the semiconductor device 100 may include a process-residue pattern group 50-3 illustrated in FIG. 8 instead of the process-residue pattern groups 50-1 and 50-2. FIG. 8 is a cross-sectional view illustrating the configuration of a semiconductor device according to the first modification of the embodiment. The semiconductor device 100 includes a stacked body 10i instead of the stacked body 10 (refer to FIG. 2). The stacked body 10i is different from the stacked body 10 in that the staircase region STR-1 is not provided or most of a staircase structure corresponding to the staircase structure of the staircase region STR-1 in the embodiment is removed and accordingly the staircase region STR-1 is not substantially provided. That is, in the first modification of the embodiment, a portion corresponding to the staircase structure of the staircase region STR-1 in the stacked body 10i is replaced with a plug region PPR-3. In addition, although FIG. 8 illustrates the example that a part of the staircase structure is not removed and remains on the +X side of the plug region PPR-3, the part of the staircase structure may be removed.

The plug region PPR-3 is disposed on the +X side of the memory cell array region MAR of the stacked body 10i. Penetration plugs 40-7 to 40-9 are disposed in the plug region PPR-3.

For example, each of the penetration plugs 40-7 to 40-9 extends from the same Z-directional position as the +Z side end 10a of the stacked body 10i or from a position on the +Z side of the +Z side end 10a to a position on the −Z side of the −Z side end 10b and penetrates an insulating film 61-3 and the stacked body 10i (in FIG. 8, a case is exemplified in which the penetration plugs 40-7 to 40-9 extend from the same Z-directional position as the +Z side end 10a of the stacked body 10i to a position on the −Z side of the −Z side end 10b). The insulating film 61-3 is selectively embedded in the plug region PPR-3 separately from the interlayer insulating films 60-1 to 60-3. In addition, each of the penetration plugs 40-7 to 40-9 penetrates a lower conductive layer SL of the stacked body 10i to reach a conductive film CF8 in the peripheral circuit region PCR. Each of the penetration plugs 40-7 to 40-9 and the stacked body 10i and the conductive layer SL are insulated from each other by the insulating film 61-3 surrounding the peripheries of the penetration plugs 40-7 to 40-9 in the XY cross section view. As illustrated in FIG. 8, signals can be transmitted and received between the upper layer wiring (not illustrated) and the control circuit through a plug V12, a contact CP7, the penetration plug 40-7 (or 40-8 or 40-9), the conductive film CF8, a plug V14, a conductive film CF7, and a plug V13. In addition, the number of plugs or contacts disposed between the upper layer wiring (not illustrated) and the control circuit is not limited to the above. For example, the contact CP7 and the penetration plug 40-7 (or 40-8 or 40-9) may be integrated to provide a plug extending from a position on the +Z side of the +Z side end 10a of the stacked body 10i to a position on the −Z side of the −Z side end 10b.

The process-residue pattern group 50-3 is disposed at a position adjacent to or close to the plug region PPR-3. The process-residue pattern group 50-3 is disposed at a position adjacent to or close to the −X side with respect to the plug region PPR-3. The process-residue pattern group 50-3 includes remnants (process-residue patterns) of alignment marks formed at the same time when the semiconductor columnar member 22 is formed. Each process-residue pattern has a quadrangular or disjoined quadrangular shape, in the XY plane view (refer to FIG. 9A). In each process-residue pattern, a +Z side end has a Z height corresponding to the +Z side end of the semiconductor columnar member 22.

For example, the process-residue pattern group 50-3 disposed at a position adjacent to or close to the plug region PPR-3 can be formed by manufacturing the semiconductor device 100 as follows.

In the same manner as in the step illustrated in FIGS. 3A and 3B, a plurality of columnar bodies CM1 is formed in the memory cell array region MAR, and a plurality of alignment marks MX1 and MY1 is formed in the plug region PPR-3.

In this case, the alignment mark MX1 can be formed in a linear shape extending in the Y direction in the XY plane view, and the alignment mark MY1 can be formed in a linear shape extending in the X direction in the XY plane view.

In the same manner as in the step illustrated in FIGS. 4A and 4B, the stacked structure SST2 is formed by alternately stacking the insulating layer 16 and the sacrificial film 17 multiple times on the stacked structure SST1. Then, the resist film RF that covers the +Z side surface of the stacked structure SST2 is formed.

In this case, the position measurement unit of the exposure apparatus performs an alignment inspection for measuring (detecting) a reference position for determining a pattern transfer position to the resist film RF before the pattern formation, using alignment marks MX1 and MY1. By using the detected reference position, as illustrated by the two-dot chain line in FIG. 4B, the formation position $FP_{CH2}$ of the hole CH2 corresponding to the columnar body CM2 of the memory cell array region MAR to be transferred to the resist film RF and the formation positions $FP_{MX2}$ and $FP_{MY2}$ ($FP_{MX2}$ is omitted in FIG. 4B) of the alignment marks MX2 and MY2 in the plug region PPR-3 are determined. Then, the exposure unit of the exposure apparatus exposes the resist film RF, to form a latent image of the pattern at the determined formation position.

In the same manner as in the step illustrated in FIGS. 5A and 5B, the developing apparatus develops the latent image on the resist film RF. As a result, the resist pattern RP including the hole CH2 corresponding to the formation position of the columnar body CM2 in the memory cell array region MAR and the alignment marks MX2 and MY2 in the plug region PPR-3 is formed on the stacked structure SST2.

Then, using alignment marks MX1 and MY1 and alignment marks MX2 and MY2, the amount of overlay misalignment between the formation positions of the plurality of columnar bodies CM1 and the formation positions of the plurality of holes CH2 is inspected.

If the amount of overlay misalignment between the formation positions of the plurality of columnar bodies CM1 and the formation positions of the plurality of holes CH2 is not within the allowable range, the resist pattern RP is peeled off and the step illustrated in FIGS. 4A and 4B and the step illustrated in FIGS. 5A and 5B are performed again.

On the other hand, if the amount of overlay misalignment between the formation positions of the plurality of columnar bodies CM1 and the formation positions of the plurality of holes CH2 is within the allowable range, the step illustrated in FIGS. 6A and 6B are performed.

In the same manner as in the step illustrated in FIGS. 6A and 6B, the columnar bodies CM2 are formed in the memory cell array region MAR, and the patterns MX2' and MY2' corresponding to the alignment marks MX2 and MY2 are formed in the plug region PPR-3. In this case, the pattern MX2' can be formed in a linear shape extending in the Y direction in the XY plane view, and the pattern MY2' can be formed in a linear shape extending in the X direction in the XY plane view.

Figure 9A:
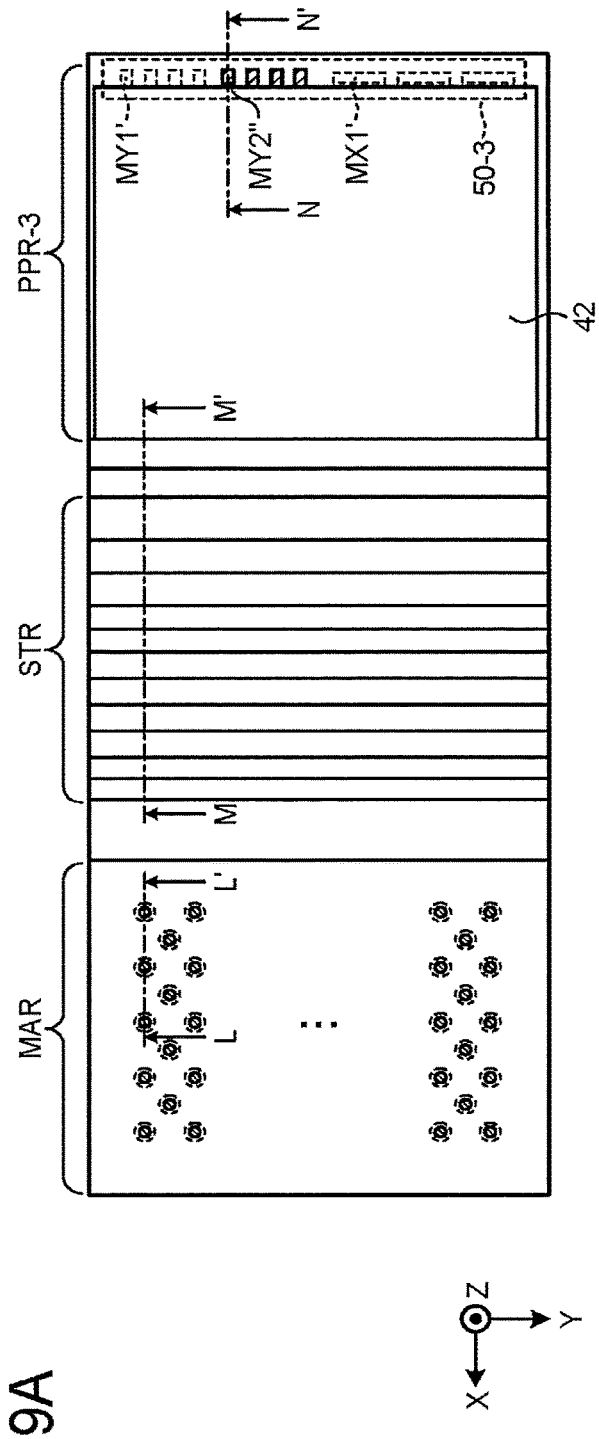
FIGS. 9A and 9B are a plan view and a cross-sectional view illustrating a method of manufacturing the semiconductor device according to the first modification of the embodiment.
Figure 9B:
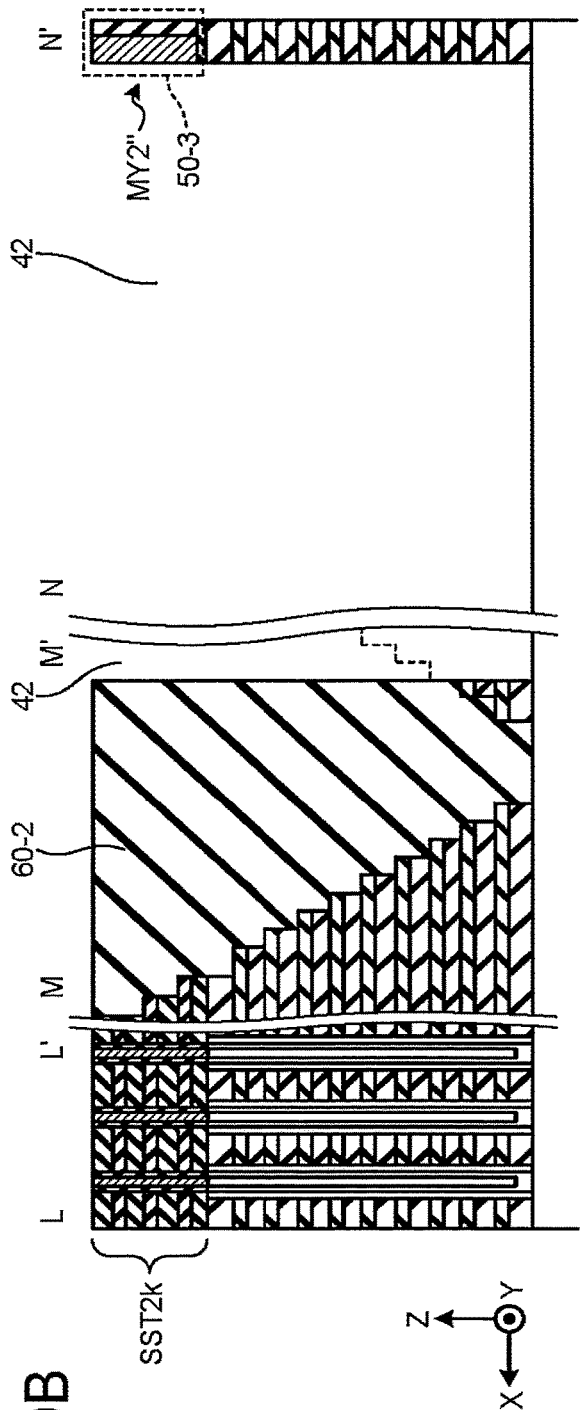

Then, in step illustrated in FIGS. 9A and 9B, in the same manner as in the step illustrated in FIGS. 7A and 7B, a staircase structure (refer to the dotted line in FIG. 9B) is formed in regions corresponding to the staircase regions STR-1 and STR-2 (refer to FIG. 8) of the embodiment. In this case, in the ZX cross section view, a second staircase structure (staircase structure on the left side in FIG. 9B) having a linear symmetrical structure with respect to the staircase structure indicated by the dotted line in FIG. 9B can also be formed. Thereafter, the interlayer insulating film 60-2 is formed around the stacked structures SST1 and SST2k in which the staircase structure is formed. FIG. 9A is a plan view illustrating a method of manufacturing the semiconductor device according to the first modification of the embodiment. FIG. 9B is a cross-sectional view illustrating the method of manufacturing the semiconductor device according to the first modification of the embodiment. FIG. 9B illustrates an enlarged cross section of the configuration in FIG. 9A taken along L-L' line on the left side, an enlarged cross section of the configuration illustrated in FIG. 9A taken along M-M' line in the middle, and an enlarged cross section of the configuration in FIG. 9A taken along N-N' line on the right side.

Then, in the plug region PPR-3, a resist pattern (not illustrated) with openings at the formation position of an opening 42, which overlaps most of the staircase structure of a region corresponding to the staircase region STR-1 of the embodiment, is formed on the stacked structure SST2k and the interlayer insulating film 60-2 as illustrated in FIG. 9A. Anisotropic etching, such as a reactive ion etching (RIE), is performed using the resist pattern as a mask, so that the opening 42 is formed and most of the staircase structure of the region corresponding to the staircase region STR-1 of the embodiment is removed.

In this case, the alignment marks MX1 and MY1 and the patterns MX2' and MY2' corresponding to the alignment marks MX2 and MY2 are mostly removed, but partially remain as the process-residue pattern group 50-3. For example, the process-residue pattern group 50-3 includes a process-residue pattern MX1' of the alignment mark MX1, a process-residue pattern MY1' of the alignment mark MY1, and a process-residue pattern MY2" of the pattern MY2'. In a case where the opening 42 is formed so as to remove most of the staircase structure, no process-residue pattern may remain in a region adjacent to the −X side of the opening 42.

Thus, also in the first modification of the embodiment, since the distance between each alignment mark and the memory cell array region can be shortened without a dedicated region for the alignment mark, it is possible to improve the measurement accuracy of the reference position of the pattern transfer and the measurement accuracy of the misalignment amount, reducing the cost.

Alternatively, as a second modification of the embodiment, the semiconductor device 100 may include process-residue pattern groups 50-4 and 50-5 illustrated in FIG. 2 instead of the process-residue pattern groups 50-1 to 50-3 or in addition to the process-residue pattern groups 50-1 to 50-3. The process-residue pattern groups 50-4 and 50-5 are disposed at positions adjacent to or close to the plug region PPR-2. The process-residue pattern group 50-4 is disposed at a position adjacent to or close to the +X side with respect to the plug region PPR-2, and the process-residue pattern group 50-5 is disposed at a position adjacent to or close to the −X side of the plug region PPR-2.

The process-residue pattern group 50-4 includes remnants (process-residue patterns) of alignment marks with respect to the semiconductor columnar member 21 (or 22). Each process-residue pattern has a quadrangular or disjoined quadrangular shape in the XY plane view (refer to FIG. 10A). In each process-residue pattern, a +Z side end has a Z height corresponding to the +Z side end of the semiconductor columnar member 21 (or 22).

The process-residue pattern group 50-5 includes a plurality of remnants (process-residue patterns) of alignment marks with respect to the semiconductor columnar member 22 (or 21). Each process-residue pattern has a quadrangular or disjoined quadrangular shape, in the XY plane view (refer to FIG. 10A). In each process-residue pattern, a +Z side end has a Z height corresponding to the +Z side end of the semiconductor columnar member 22 (or 21).

For example, the process-residue pattern groups 50-4 and 50-5 disposed at positions adjacent to or close to the plug region PPR-2 can be formed by manufacturing the semiconductor device 100 as follows.

In the same manner as in the step illustrated in FIGS. 3A and 3B, the stacked structure SST1 is formed by alternately depositing the insulating layer 12 and the sacrificial film 14 multiple times, and then a thick resist pattern with opening in a predetermined region is formed on the stacked structure SST1 in the staircase regions STR-1 and STR-2 (refer to FIG. 2). Then, a set of the insulating layer 12 and the sacrificial film 14 in a region corresponding to the opening of the resist pattern are etched by reactive ion etching (RIE). Thereafter, the size of the resist pattern is reduced by slimming. Then, using the resist pattern as a mask, a set of the insulating layer 12 and the sacrificial film 14 is etched by the RIE method. Then, the slimming of the resist pattern and the etching of the set of the insulating layer 12 and the sacrificial film 14 described above are repeated. As a result, a staircase structure is formed in the portions of the staircase regions STR-1 and STR-2 in the stacked structure SST1. An interlayer insulating film is formed around the stacked structure SST1. Thereafter, in the same manner as in the step illustrated in FIGS. 3A and 3B, a plurality of columnar bodies CM1 is formed in the memory cell array region MAR, and a plurality of alignment marks MX1 and MY1 is formed in the plug region PPR-2.

Figure 10A:
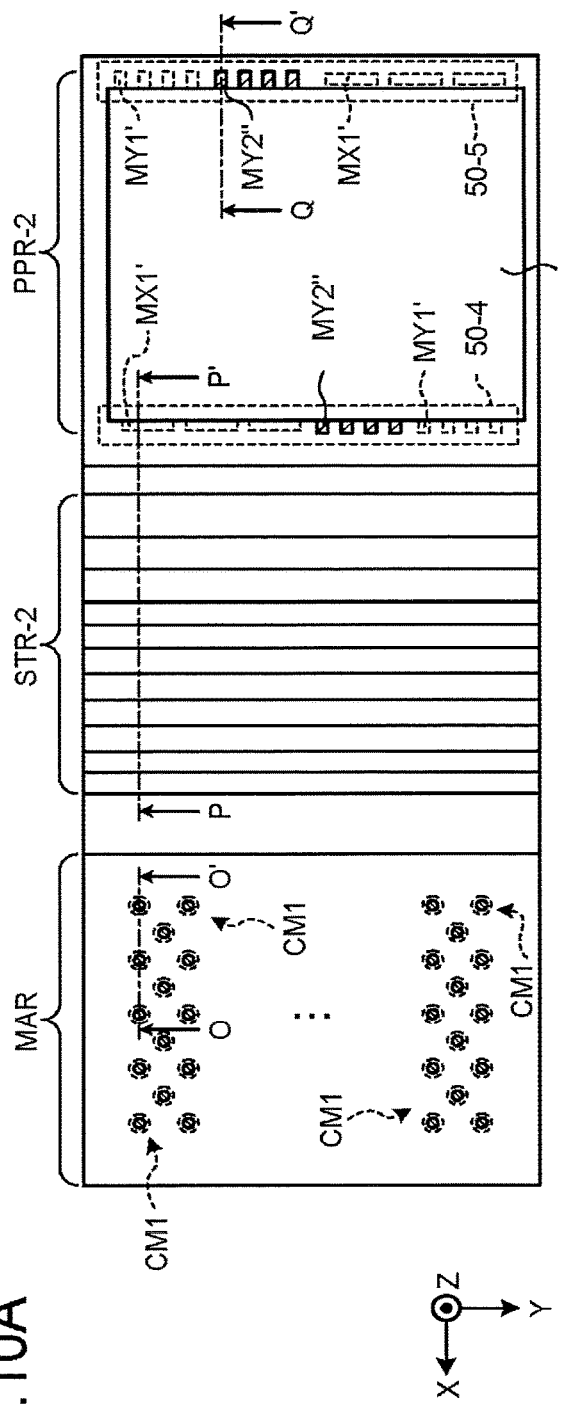
FIGS. 10A and 10B are a plan view and a cross-sectional view illustrating a method of manufacturing a semiconductor device according to a second modification of the embodiment.
Figure 10B:
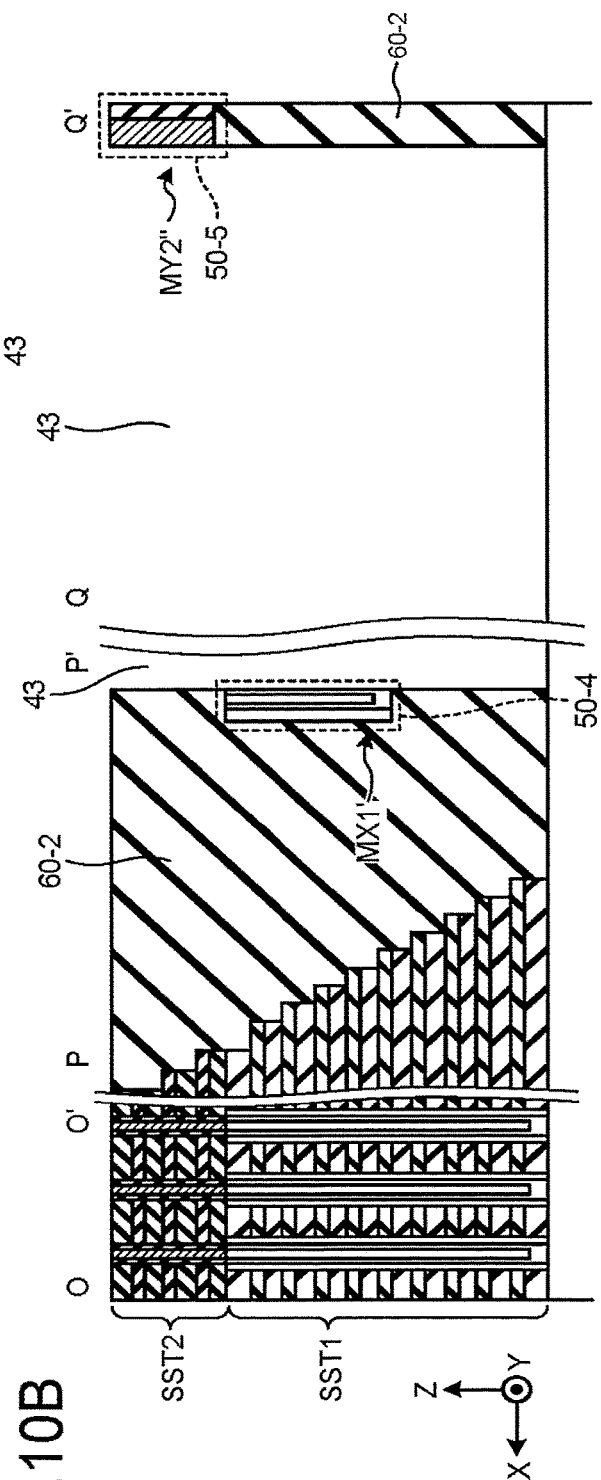

In this case, the alignment mark MX1 can be formed in an approximate linear shape extending in the Y direction in the XY plane view, and the alignment mark MY1 can be formed in an approximate linear shape extending in the X direction in the XY plane view. In addition, as illustrated in FIGS. 10A and 10B, the alignment marks MX1 and MY1 are formed in the interlayer insulating film 60-2 around the stacked structure SST1. FIG. 10A is a plan view illustrating a method of manufacturing the semiconductor device according to the second modification of the embodiment. FIG. 10B is a cross-sectional view illustrating the method of manufacturing the semiconductor device according to the second modification of the embodiment. FIG. 10B illustrates an enlarged cross section of the configuration illustrated in FIG. 10A taken along O-O' line on the left side, an enlarged cross section of the configuration illustrated in FIG. 10A taken along P-P' line in the middle, and an enlarged cross section of the configuration illustrated in FIG. 10A taken along Q-Q' line on the right side. In addition, although FIG. 10B illustrates the example that the −Z side end of the process-residue pattern MX1' of the alignment mark MX1 is higher in the Z height than the −Z side end of the columnar body CM1, the −Z side end of the process-residue pattern MX1' of the alignment mark MX1 may have the same Z height as the −Z side end of the columnar body TM1.

Then, in the step illustrated in FIGS. 10A and 10B, the stacked structure SST2 is formed by alternately stacking the insulating layer 16 and the sacrificial film 17 multiple times on the stacked structure SST1. Thereafter, in the same manner as in the step illustrated in FIGS. 7A and 7B, a staircase structure is formed in the staircase regions STR-1 and STR-2. Then, the interlayer insulating film 60-2 is formed around the stacked structure SST2 in which the staircase structure is formed, and then the resist film RF (refer to FIG. 4B) that covers the +Z side surfaces of the stacked structure SST2 and the interlayer insulating film 60-2 is formed.

In this case, the position measurement unit of the exposure apparatus performs an alignment inspection for measuring (detecting) a reference position for determining a pattern transfer position to the resist film RF before pattern formation, using the alignment marks MX1 and MY1. By using the detected reference position, as illustrated by the two-dot chain line in FIG. 4B, the formation position $FP_{CH2}$ of the hole CH2 corresponding to the columnar body CM2 of the memory cell array region MAR-2 to be transferred to the resist film RF and the formation positions $FP_{MX2}$ and $FP_{MY2}$ ($FP_{MX2}$ is omitted in FIG. 4B) of the alignment marks MX2 and MY2 in the plug region PPR-2 are determined. Then, the exposure unit of the exposure apparatus exposes the resist film RF to form a latent image of the pattern at the determined formation position.

In the same manner as in the step illustrated in FIGS. 5A and 5B, the developing apparatus develops the latent image on the resist film RF. As a result, the resist pattern RP including the hole CH2 corresponding to the formation position of the columnar body CM2 in the memory cell array region MAR-2 and the alignment marks MX2 and MY2 in the plug region PPR-2 is formed on the stacked structure SST2 and the interlayer insulating film 60-2.

Then, using the alignment marks MX1 and MY1 and the alignment marks MX2 and MY2, the amount of overlay misalignment between the formation positions of the columnar bodies CM1 and the formation positions of the holes CH2 is inspected.

If the amount of overlay misalignment between the formation positions of the columnar bodies CM1 and the formation positions of the holes CH2 is not within the allowable range, the resist pattern RP is peeled off and the formation of the resist film RF similar to the step illustrated in FIGS. 4A and 4B and the formation of the resist pattern RP similar to the step illustrated in FIGS. 5A and 5B are performed again.

On the other hand, if the amount of overlay misalignment between the formation positions of the columnar bodies CM1 and the formation positions of the holes CH2 is within the allowable range, in the same manner as in the step illustrated in FIGS. 6A and 6B, the columnar bodies CM2 are formed in the memory cell array region MAR and the patterns MX2' and MY2' corresponding to the alignment marks MX2 and MY2 are formed in the plug region PPR-2. In this case, the pattern MX2' can be formed in an approximate linear shape extending in the Y direction in the XY plane view, and the pattern MY2' can be formed in an approximate linear shape extending in the X direction in the XY plane view. In addition, as illustrated in FIGS. 10A and 10B, the patterns MX2' and MY2' are formed in the interlayer insulating film 60-2 around the stacked structure SST2.

Then, in the plug region PPR-2, a resist pattern (not illustrated) with an opening to become an opening 43 as illustrated in FIG. 10A is formed on the stacked structure SST2 and the interlayer insulating film 60-2. The opening 43 is formed by anisotropic etching, such as reactive ion etching (RIE), using the resist pattern as a mask. In addition, the opening 43 can be formed so as to penetrate, for example, the interlayer insulating film 60-2 (refer to FIG. 2).

In this case, the alignment marks MX1 and MY1 and the patterns MX2' and MY2' corresponding to the alignment marks MX2 and MY2 are mostly removed, but partially remain in the interlayer insulating film 60-2 as the process-residue pattern groups 50-4 and 50-5. For example, the process-residue pattern groups 50-4 and 50-5 include the process-residue pattern MX1' of the alignment mark MX1, the process-residue pattern MY1' of the alignment mark MY1, and the process-residue pattern MY2" of the pattern MY2'.

Thereafter, the insulating film 61-2 is embedded in the opening 43, a hole extending from the same Z-directional position as the +Z side end 10a of the stacked body 10 or from a position on the +Z side of the +Z side end 10a to a position on the −Z side of the −Z side end 10b of the stacked body 10 is formed in the insulating film 61-2, and a conductive material (for example, tungsten) is embedded in the hole to form the penetration plugs 40-4 to 40-6, as in the embodiment.

Thus, also in the second modification of the embodiment, since the distance between each alignment mark and the memory cell array region can be shortened without a dedicated region for the alignment mark, it is possible to improve the measurement accuracy of the misalignment amount and to reduce the cost.

Alternatively, inspection marks other than alignment marks may be disposed in the plug region PPR. For example, stepwise graduations for measuring the slimming amount of the resist when forming the staircase structure in the staircase region STR may be disposed in the plug region PPR.

That is, as a third modification of the embodiment, the semiconductor device 100 may include a process-residue pattern group 50-6 illustrated in FIG. 2 instead of the process-residue pattern groups 50-1 to 50-3 or in addition to the process-residue pattern groups 50-1 to 50-3. The process-residue pattern group 50-6 is disposed at a position adjacent to or close to the plug region PPR-2. The process-residue pattern group 50-6 is disposed at a position adjacent to or close to the +X side with respect to the plug region PPR-2. The process-residue pattern group 50-6 is disposed at a position (Z height) corresponding to steps of the staircase structure in the staircase region STR-2. Each process-residue pattern in the process-residue pattern group 50-6 has a quadrangular (for example, an approximately rectangular shape) or disjoined quadrangular shape (for example, an approximate rectangular shape), in the XY plane view.

For example, the process-residue pattern group 50-6 disposed at a position adjacent to or close to the plug region PPR-2 can be formed by manufacturing the semiconductor device 100 as follows. The third modification of the embodiment describes an example that the insulating layer 12 and the conductive film 11 are stacked to form the stacked body 10 and etching of a sacrificial film through a slit and embedding of a conductive material in the void are not performed.

That is, in the step illustrated in FIGS. 3A and 3B, a stacked structure SST1' is formed by alternately depositing the insulating layer (for example, a silicon oxide film) 12 and the conductive film (for example, a film containing a metal, such as aluminum, as a main component or a conductive semiconductor film such as polysilicon containing impurities) 11 multiple times.

Figure 11A:
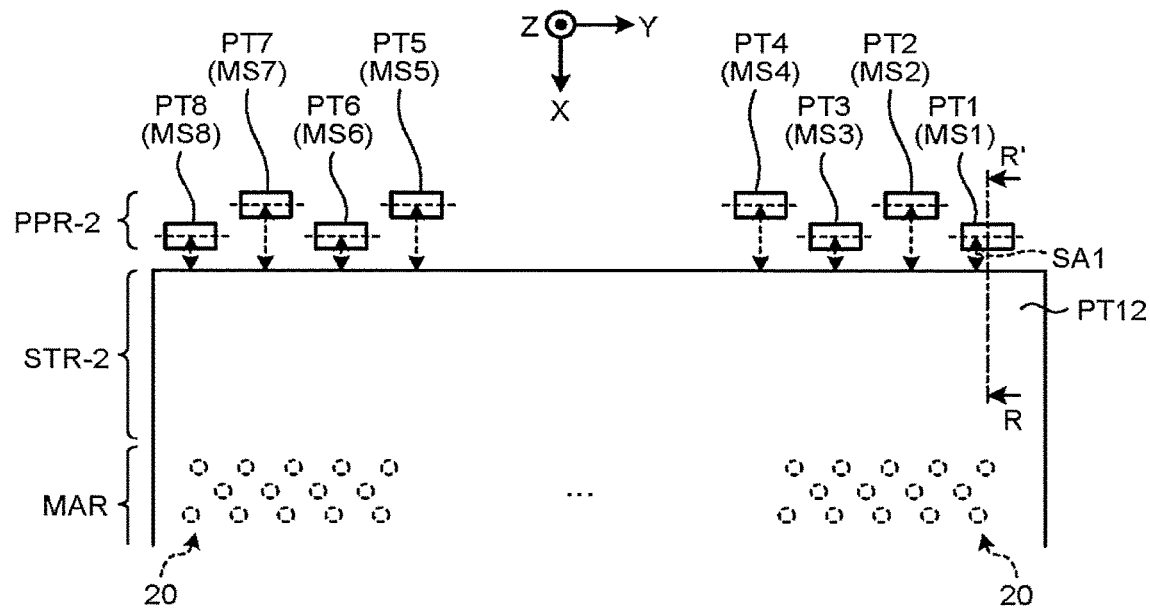
FIGS. 11A and 11B are a plan view and a cross-sectional view illustrating a method of manufacturing a semiconductor device according to a third modification of the embodiment.
Figure 11B:
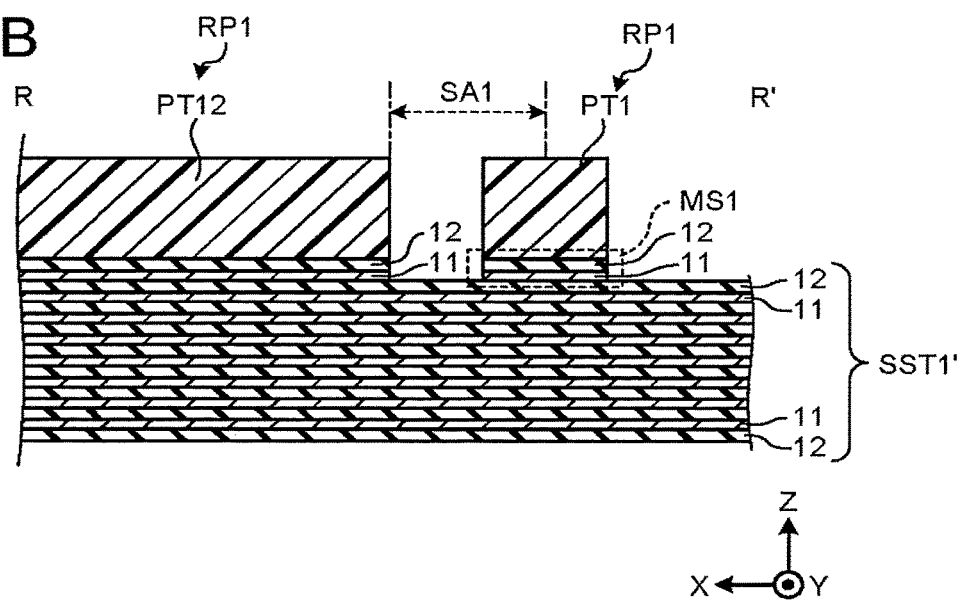

Then, the step illustrated in FIGS. 4A and 4B, the step illustrated in FIGS. 5A and 5B, and the step illustrated in FIGS. 6A and 6B are performed in the same manner as in the embodiment. Thereafter, in the step illustrated in FIGS. 11A and 11B, a part of the staircase structure and stepwise graduations are formed. FIG. 11A is a plan view illustrating a method of manufacturing the semiconductor device according to the third modification of the embodiment, and FIG. 11B is a cross-sectional view illustrating the method of manufacturing the semiconductor device according to the third modification of the embodiment. FIG. 11B illustrates an enlarged cross section of the configuration in FIG. 11A taken along with R-R' line.

That is, a resist pattern RP1 including a pattern PT12 corresponding to the staircase structure and patterns PT1 to PT8 corresponding to stepwise graduations MS1 to MS8 is formed on the stacked body. The pattern PT12 selectively covers the memory cell array region MAR and the staircase region STR-2, and has an approximately rectangular shape in the XY plane view. Each of the patterns PT1 to PT8 has an approximately rectangular shape in the XY plane view. Each of the patterns PT1, PT3, PT6, and PT8 has a Y-directional length shorter than the pattern PT12, and the distances of the patterns PT1, PT3, PT6, and PT8 from the −X side end of the pattern PT12 are approximately the same. Each of the patterns PT2, PT4, PT5, and PT7 has a Y-directional length shorter than the pattern PT12, and the distances of the patterns PT2, PT4, PT5, and PT7 from the −X side end of the pattern PT12 are approximately the same. The distances of the patterns PT2, PT4, PT5, and PT7 from the −X side end of the pattern PT12 are larger than the distances of the patterns PT1, PT3, PT6, and PT8 from the −X side end of the pattern PT12.

Using the pattern PT12 and the patterns PT1 to PT8 of the resist pattern RP1 as a mask, a set of the insulating layer 12 and the conductive film 11 is etched by reactive ion etching (RIE). As a result, the −X side end of the staircase structure and the stepwise graduations MS1 to MS8 are formed. In the step illustrated in FIG. 11B, a set of the insulating layer 16 and the conductive film 15 may be etched instead of the set of the insulating layer 12 and the conductive film 11, although the insulating layer 16 and the conductive film 15 are omitted in FIG. 11B.

Then, using the stepwise graduations MS1 to MS8, the reference length of the slimming amount is measured. For example, as illustrated in FIG. 11B, a distance SA1 from the center of the stepwise graduation MS1 to the −X side end of the staircase structure is measured.

Figure 12A:
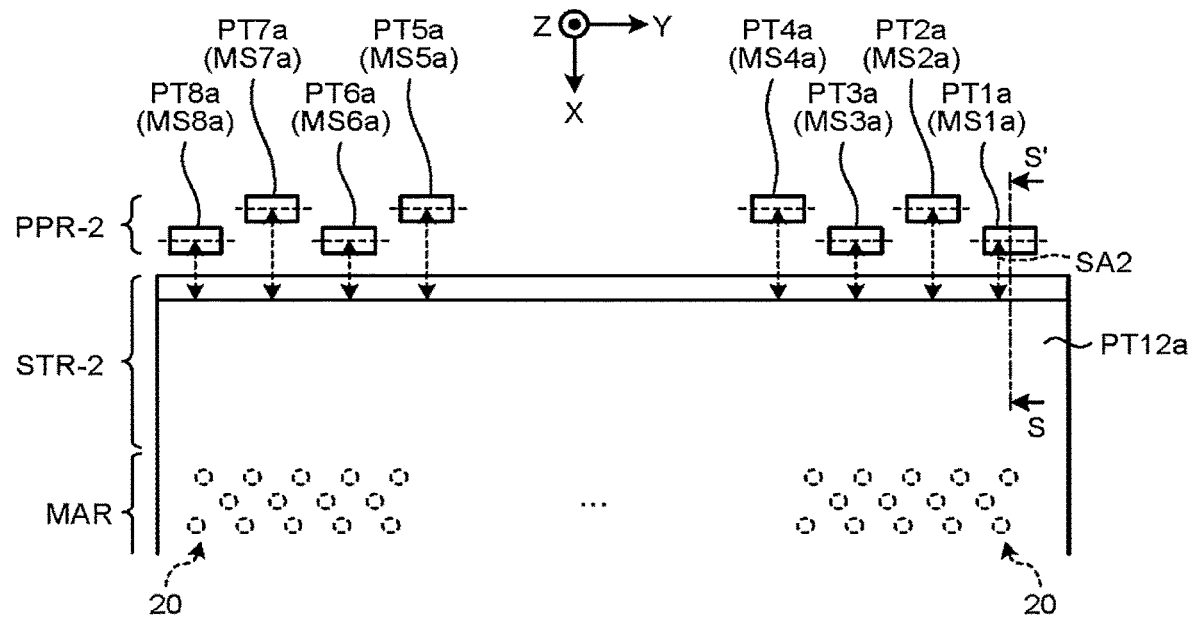
FIGS. 12A and 12B are a plan view and a cross-sectional view illustrating a method of manufacturing the semiconductor device according to the third modification of the embodiment.
Figure 12B:
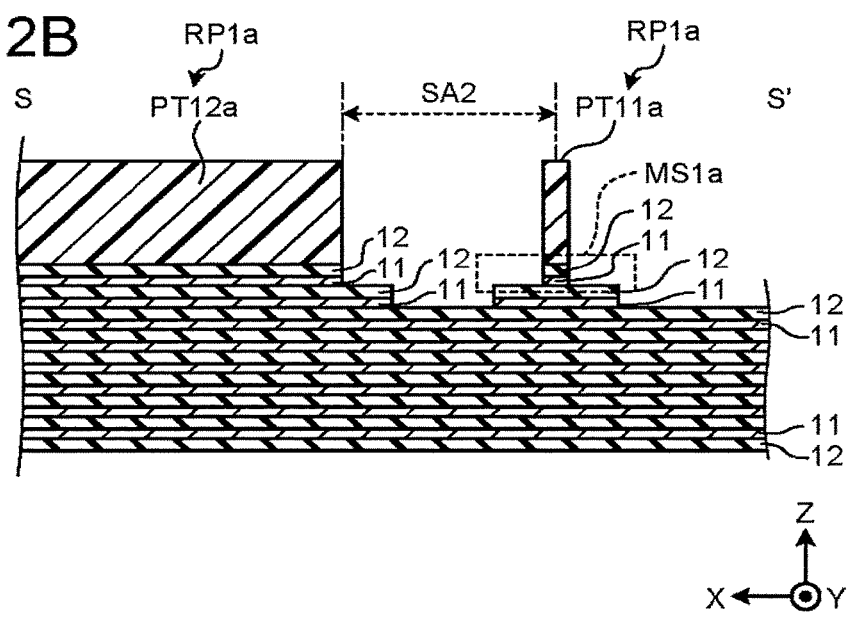

In the step illustrated in FIGS. 12A and 12B, another part of the staircase structure is formed. That is, the size of a resist pattern RP1a is reduced by slimming, and the size of a pattern PT12a and the sizes of patterns PT1a to PT8a are reduced. FIG. 12A is a plan view illustrating a method of manufacturing the semiconductor device according to the third modification of the embodiment, and FIG. 12B is a cross-sectional view illustrating the method of manufacturing the semiconductor device according to the third modification of the embodiment. FIG. 12B illustrates an enlarged cross section of the configuration in FIG. 12A taken along with S-S' line. Using the pattern PT12a and the patterns PT1a to PT8a of the slimmed resist pattern RP1a as a mask, a set of the insulating layer 12 (or 16) and the conductive film 11 (or 15) is etched by reactive ion etching (RIE). As a result, a first step of the staircase structure is formed, and steps corresponding to stepwise graduations MS1a to MS8a are also formed.

Then, using the stepwise graduations MS1a to MS8a, a length indicating the slimming amount is measured. For example, as illustrated in FIG. 12B, a distance SA2 from the center of the stepwise graduation MS1a to the stepped portion of the first stair of the staircase structure is measured. In this case, the length indicating the slimming amount can be calculated by $\Delta SA = SA2 - SA1$.

Similarly, it is possible to process the staircase structure while measuring the slimming amount. Then, in the step illustrated in FIGS. 13A and 13B, the resist pattern at the time of processing the staircase structure is peeled off and then the interlayer insulating film 60-2 is formed around the staircase structure. Thereafter, a resist pattern with an opening to become an opening 44 in the plug region PPR-2 as illustrated in FIG. 13A is newly formed on the processed stacked body. FIG. 13A is a plan view illustrating a method of manufacturing the semiconductor device according to the third modification of the embodiment, and FIG. 13B is a cross-sectional view illustrating the method of manufacturing the semiconductor device according to the third modification of the embodiment. FIG. 13B illustrates an enlarged cross section of the configuration in FIG. 13A taken along with T-T' line. The opening 44 is formed by anisotropic etching, such as reactive ion etching (RIE), using a resist pattern (not illustrated) as a mask. In addition, the opening 44 can be formed so as to penetrate, for example, the interlayer insulating film 60-2 (refer to FIG. 2).

In this case, the stepwise graduations MS1a to MS8a are mostly removed, but partially remain as the process-residue pattern group 50-6. For example, the process-residue pattern group 50-6 includes a process-residue pattern MS1a' of the stepwise graduation MS1a, a process-residue pattern MS3a' of the stepwise graduation MS3a, a process-residue pattern MS6a' of the stepwise graduation MS6a, and a process-residue pattern MS8a' of the stepwise graduation MS8a.

Thereafter, the insulating film 61-2 is embedded in the opening 44, a hole extending from the same Z-directional position as the +Z side end 10a of the stacked body 10 or from a position on the +Z side of the +Z side end 10a to a position on the −Z side of the −Z side end 10b of the stacked body 10 is formed in the insulating film 61-2, and a conductive material (for example, tungsten) is embedded in the hole to form the penetration plugs 40-4 to 40-6, as in the embodiment.

Thus, also in the third modification of the embodiment, since the distance between the stepwise graduation and the staircase structure can be shortened without a dedicated region for the stepwise graduation, it is possible to improve the measurement accuracy of the processing amount of the staircase structure and to reduce the cost.

The above embodiment and modifications have described the example that an opening for forming a plug region is formed so as to cross various marks or patterns corresponding to the various marks in the XY plane view and each process-residue pattern has a disjoined quadrangular shape due to remaining parts of the various marks or the patterns corresponding to the various marks. Thereby, the process-residue pattern is formed at a position adjacent to the plug region in the XY plane view. However, the embodiment and each modification are not limited thereto. For example, an opening for forming a plug region may be formed at a position away from at least some of various marks or patterns corresponding to the various marks in the XY plane view, and the various marks or the patterns corresponding to the various marks may be disposed as process-residue patterns in quadrangular pattern closely to the plug region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a stacked body disposed above a substrate, the stacked body including a conductive film and an insulating layer alternately disposed in a stacking direction;
    a semiconductor columnar member that penetrates the stacked body in the stacking direction;
    an insulating film that surrounds the semiconductor columnar member and that penetrates the stacked body in the stacking direction; and
    a pattern disposed at a position adjacent to or close to a region and having a quadrangular or disjoined quadrangular shape, the region including a penetration plug, the penetration plug extending from a position same as or above an upper end of the stacked body to a position below a lower end of the stacked body in the stacking direction,
    wherein the pattern includes:
        a first pattern having a first height; and
        a second pattern having a second height different from the first height, and
    each of the first height and the second height is a position at an upper end with respect to a substrate surface in the stacking direction.

2. The semiconductor device according to claim 1, wherein
    the quadrangular shape includes a linear shape.

3. The semiconductor device according to claim 1, wherein
    the quadrangular shape includes a rectangular shape.

4. The semiconductor device according to claim 1, wherein
    the pattern has a height corresponding to a height of the semiconductor columnar member at an upper end with respect to a substrate surface in the stacking direction.

5. The semiconductor device according to claim 1, wherein
    the semiconductor columnar member comprises
        a first semiconductor columnar member, and
        a second semiconductor columnar member stacked on the first semiconductor columnar member, and
    the pattern has a height corresponding to a height of the first semiconductor columnar member at an upper end with respect to a substrate surface in the stacking direction.

6. The semiconductor device according to claim 1, wherein
    the semiconductor columnar member comprises a first semiconductor columnar member, and
a second semiconductor columnar member stacked on the first semiconductor columnar member, and
the pattern has a height corresponding to a height of the second semiconductor columnar member at an upper end with respect to a substrate surface in the stacking direction.

7. The semiconductor device according to claim 1, wherein
the pattern further includes,
a third pattern having a third height different from both the first height and the second height, and
the third height is a position at an upper end with respect to a substrate surface in the stacking direction.

8. The semiconductor device according to claim 1, wherein
the semiconductor columnar member comprises
a first semiconductor columnar member, and
a second semiconductor columnar member stacked on the first semiconductor columnar member,
the first height corresponds to a height of the first semiconductor columnar member; and
the second height corresponds to a height of the second semiconductor columnar member.

9. The semiconductor device according to claim 1, wherein
the stacked body has a staircase structure,
the
first height corresponds to a height of the semiconductor columnar member; and
the second height corresponds to a step surface of the staircase structure.

10. The semiconductor device according to claim 1, wherein
the stacked body has a staircase structure,
the semiconductor columnar member comprises
a first semiconductor columnar member, and
a second semiconductor columnar member stacked on the first semiconductor columnar member,
first height corresponds to a height of the first semiconductor columnar member;
the second height corresponds to a height of the second semiconductor columnar member; and
the pattern further includes a third pattern having a third height corresponding to a step surface of the staircase structure, and
the third height is a position at an upper end with respect to a substrate surface in the stacking direction.

11. The semiconductor device according to claim 1, wherein
the stacked body has a staircase structure, and
the region including the penetration plug is disposed in the stacked body between a region penetrated by the semiconductor columnar member and a region having the staircase structure.

12. The semiconductor device according to claim 1, wherein
the pattern is at least a part of an inspection mark.

13. A method of manufacturing a semiconductor device, the method comprising:
integrally forming a first inspection mark and a first partial structure that is to become a part of a structure, the structure penetrating a stacked body including a first film and a second film alternately disposed in a stacking direction, and the structure including a semiconductor columnar member surrounded by a first insulating film;
forming an opening in a region overlapping with or close to the first inspection mark;
embedding a second insulating film in the opening; and
forming, in the second insulating film, a hole extending to below a lower end of the stacked body, and filling a conductive material in the hole to form a penetration plug.

14. The method of manufacturing a semiconductor device according to claim 13, further comprising:
performing an alignment inspection using the first inspection mark; and
forming a resist pattern including a second inspection mark and a pattern corresponding to a second partial structure, the second partial structure being joined with the first partial structure as another part of the structure,
wherein the forming the opening includes removing a region overlapping with or close to both of the first inspection mark and the second inspection mark.

15. The method of manufacturing a semiconductor device according to claim 14, further comprising:
performing an overlay inspection of the first partial structure and the pattern corresponding to the second partial structure using the first inspection mark and the second inspection mark.

16. The method of manufacturing a semiconductor device according to claim 13,
wherein the forming the opening is performed so as to penetrate the stacked body in the region overlapping with or close to the first inspection mark.

17. A semiconductor device comprising:
a stacked body disposed above a substrate, the stacked body including a conductive film and an insulating layer alternately disposed in a stacking direction;
a semiconductor columnar member that penetrates the stacked body in the stacking direction;
an insulating film that surrounds the semiconductor columnar member and that penetrates the stacked body in the stacking direction; and
a pattern disposed at a position adjacent to or close to a region and having a quadrangular or disjoined quadrangular shape, the region including a penetration plug, the penetration plug extending from a position same as or above an upper end of the stacked body to a position below a lower end of the stacked body in the stacking direction,
wherein the stacked body has a staircase structure, and
the region including the penetration plug is disposed at a position outside the stacked body and close to the staircase structure.

18. The semiconductor device according to claim 17, wherein
the pattern has a height corresponding to a step surface of the staircase structure at an upper end with respect to a substrate surface in the stacking direction.

19. The semiconductor device according to claim 17, wherein
the pattern has a step surface corresponding to a step surface of the staircase structure.

* * * * *